(12) United States Patent
Verma et al.

(10) Patent No.: US 11,038,529 B2
(45) Date of Patent: Jun. 15, 2021

(54) WIRELESS PREAMBLE DESIGN FOR WIRELESS COMMUNICATION DEVICES AND METHODS

(71) Applicant: QUALCOMM Incorporated, San Diego, CA (US)

(72) Inventors: Lochan Verma, San Diego, CA (US); Bin Tian, San Diego, CA (US); Sameer Vermani, San Diego, CA (US); Lin Yang, San Diego, CA (US); Jialing Li Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/659,531

(22) Filed: Oct. 21, 2019

(65) Prior Publication Data

US 2020/0127681 A1 Apr. 23, 2020

Related U.S. Application Data

(60) Provisional application No. 62/749,078, filed on Oct. 22, 2018.

(51) Int. Cl.
| | |
|---|---|
| *H03M 13/00* | (2006.01) |
| *H03M 13/09* | (2006.01) |
| *H03M 13/15* | (2006.01) |
| *H04L 27/34* | (2006.01) |
| *H04L 27/18* | (2006.01) |

(Continued)

(52) U.S. Cl.
CPC ....... *H03M 13/096* (2013.01); *H03M 13/157* (2013.01); *H04L 1/0061* (2013.01); *H04L 5/0044* (2013.01); *H04L 27/186* (2013.01); *H04L 27/3416* (2013.01)

(58) Field of Classification Search
None
See application file for complete search history.

(56) References Cited

U.S. PATENT DOCUMENTS

| | | | |
|---|---|---|---|
| 2005/0226190 A1* | 10/2005 | Lam | H04W 12/1006 370/338 |
| 2013/0259017 A1 | 10/2013 | Zhang et al. | |

(Continued)

OTHER PUBLICATIONS

Tzi-Dar Chiueh; Pei-Yun Tsai; I-Wei Lai, "Mobile MIMO WiMAX System-on-Chip Design," in Baseband Receiver Design for Wireless MIMO-OFDM Communications , IEEE, 2012, pp. 321-341, doi: 10.1002/9781118188194.ch11. (Year: 2012).*

(Continued)

*Primary Examiner* — Daniel F. McMahon
(74) *Attorney, Agent, or Firm* — Loza & Loza, LLP; Kevin M. Donnelly

(57) ABSTRACT

In some aspects, methods and apparatus for wireless communications are configured to generate a packet for wireless communication where the packet includes a mark symbol in a preamble of the packet where the mark symbol includes a signature or stamp field in the mark to provide protocol information that indicates the protocol of the packet, such as an 802.11 EHT packet. In some other aspects, a cyclic redundancy check field in the mark symbol may be manipulated in various ways to indicate the protocol of the packet in lieu of providing the signature or stamp field.

28 Claims, 17 Drawing Sheets

(51) Int. Cl.
   *H04L 1/00*      (2006.01)
   *H04L 5/00*      (2006.01)

(56) References Cited

U.S. PATENT DOCUMENTS

| | | | |
|---|---|---|---|
| 2016/0112157 A1* | 4/2016 | Li | H04L 1/0061 |
| | | | 714/807 |
| 2016/0142980 A1* | 5/2016 | Lee | H04W 52/38 |
| | | | 370/336 |
| 2016/0248555 A1* | 8/2016 | Lei | H04W 16/14 |
| 2016/0329989 A1* | 11/2016 | Li | H04L 69/22 |
| 2018/0295578 A1* | 10/2018 | Liu | H04L 27/04 |
| 2019/0289549 A1* | 9/2019 | Lim | H04W 84/12 |

OTHER PUBLICATIONS

International Search Report and Written Opinion—PCT/US2019/057354—ISA/EPO—dated Jan. 29, 2020.
Venkateswaran S.R (Broadcom); "Autodetection with Signature Symbol; 11-15-0643-00-00ax-Autodetection-with-Signature-Symbol", IEEE Draft, 11-15-0643-00-00AX-Autodetection-with-Signature-Symbol, IEEE-SA Mentor, Piscataway, NJ, USA, vol. 802 .11ax, May 12, 2015 (May 12, 2015), XP068094526, pp. 1-9, [retrieved on May 12, 2015] the whole document.

\* cited by examiner

| Mark OFDM Symbol (24 bits) ||||
|---|---|---|
| Field | Bits | Description |
| Stamp/Signature | 4 | Uniquely identifies EHT and beyond preamble stamp |
| Reserved | 1 | Reserved and set to 1 |
| Other information | 9 | Other information bits |
| CRC | 4 | Carries checksum over Mark symbol |
| Tail | 6 | Set to 0 |

410 → Stamp/Signature
420 → Reserved
430 → Other information
440 → CRC
450 → Tail

| | |
|---|---|
| Protocol$_1$ | Value$_1$ |
| Protocol$_2$ | Value$_2$ |
| ⋮ | ⋮ |
| Protocol$_L$ | Value$_L$ |

520 → Protocol$_1$ / Value$_1$
530 → Protocol$_2$ / Value$_2$
540 → ⋮
550 → Protocol$_L$ / Value$_L$

*Figure 5*

| Mark OFDM Symbol (24 bits) | | |
|---|---|---|
| Field | Bits | Description |
| Reserved | 1 | Reserved and set to 1 |
| Other information | 13 or 9 | Other information bits |
| CRC | 4 or 8 | Carries checksum over Mark symbol |
| Tail | 6 | Set to 0 |

720 → Reserved
730 → Other information
740 → CRC
750 → Tail

*Figure 7*

| Protocol$_1$ | Signature Value$_1$ |
|---|---|
| Protocol$_2$ | Signature Value$_2$ |
| ⋮ | ⋮ |
| Protocol$_L$ | Signature Value$_L$ |

| Protocol₁ | Polynomial₁ |
|---|---|
| Protocol₂ | Polynomial₂ |
| ⋮ | ⋮ |
| Protocol_L | Polynomial_L |

WIRELESS PREAMBLE DESIGN FOR WIRELESS COMMUNICATION DEVICES AND METHODS

PRIORITY

This application claims priority to and the benefit of U.S. Provisional Patent Application No. 62/749,078 filed in the U.S. Patent and Trademark Office on Oct. 22, 2018, the entire content of which is incorporated herein by reference as if fully set forth below in its entirety and for all applicable purposes.

TECHNICAL FIELD

Some aspects of the present disclosure generally relate to wireless communications and, more particularly, to preamble detection.

DESCRIPTION OF THE RELATED TECHNOLOGY

Packets corresponding to different wireless communication protocols may be transmitted in a wireless network such as a wireless local area network (WLAN) managed by an access point (AP) and including one or more user devices known as stations (STAs). For example, the protocols may correspond to different versions of the Institute of Electrical and Electronics Engineers (IEEE) 802.11 wireless communication protocol including protocols supported in 802.11ax (including High Efficiency (HE) operation), 802.11be (including Extreme High Throughput (EHT) operation) and subsequent amendments. The protocols may have differently defined structures and fields as well as different multiplexing, modulation, coding and other transmission characteristics. A wireless device receiving a packet in the wireless network needs to detect the protocol of the packet in order to properly process the preamble and recover the data in the payload.

SUMMARY

The systems, methods and devices of this disclosure each have several innovative aspects, no single one of which is solely responsible for the desirable attributes disclosed herein.

One innovative aspect of the subject matter described in this disclosure can be implemented in a wireless communication device. The wireless communication device includes at least one modem and at least one processor communicatively coupled with the at least one modem. The wireless communication device also includes at least one memory communicatively coupled with the at least one processor and storing processor-readable code that, when executed by the at least one processor in conjunction with the at least one modem, is configured to generate a packet for wireless transmission, wherein the packet includes a mark symbol in a preamble of the packet, the mark symbol including a signature field containing an information value that indicates a protocol of the packet, and output the packet for wireless transmission.

Another innovative aspect of the subject matter described in this disclosure can be implemented in a method for wireless communication. The method includes generating a packet for wireless transmission, wherein the packet includes a mark symbol in a preamble of the packet, the mark symbol including a signature field containing an information value that indicates a protocol of the packet. The method further includes outputting the packet to a transmission interface for wireless transmission.

Yet another innovative aspect of the subject matter described in this disclosure can be implemented in a wireless communication device. The wireless communication device includes at least one modem, and at least one processor communicatively coupled with the at least one modem. The wireless communication device further includes at least one memory communicatively coupled with the at least one processor and storing processor-readable code that, when executed by the at least one processor in conjunction with the at least one modem, is configured to generate a packet for wireless transmission, wherein the packet includes a mark symbol in a preamble of the packet, and the mark symbol including a cyclic redundancy check (CRC) field indicating a protocol of the packet and output the packet for wireless transmission.

Another innovative aspect of the subject matter described in this disclosure can be implemented in a method for wireless communication. The method includes generating a packet for wireless transmission, wherein the packet includes a mark symbol in a preamble of the packet, and the mark symbol including a cyclic redundancy check (CRC) field indicating a protocol of the packet, and outputting the packet to a transmission interface for wireless transmission.

BRIEF DESCRIPTION OF THE DRAWINGS

Details of one or more implementations of the subject matter described in this disclosure are set forth in the accompanying drawings and the description below. However, the accompanying drawings illustrate only some typical aspects of this disclosure and are therefore not to be considered limiting of its scope. Other features, aspects, and advantages will become apparent from the description, the drawings and the claims.

FIG. 4 shows an example of the contents of a mark symbol in accordance with some aspects of the present disclosure.

FIG. 5 shows an example of a table mapping different protocols to different values in accordance with some aspects of the present disclosure.

FIG. 7 shows another example of the contents of a Mark symbol in accordance with some aspects of the present disclosure.

FIG. 9 shows another example of a table mapping different protocols to different values in accordance with some aspects of the present disclosure.

FIG. 13 shows an example of a table mapping different protocols to different polynomials in accordance with some aspects of the present disclosure.

DETAILED DESCRIPTION

Figure 1:
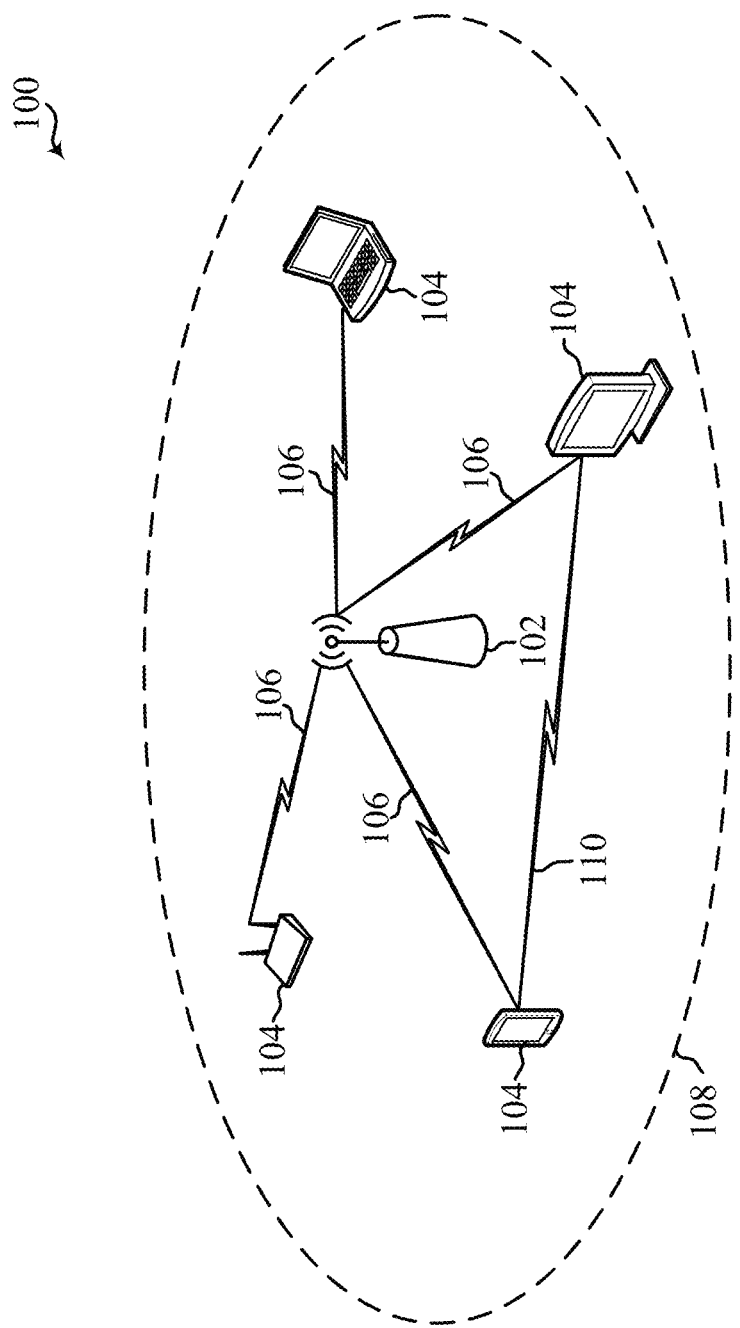
FIG. 1 a block diagram of an example wireless communication network in accordance with some aspects of the present disclosure.

The following description is directed to some particular implementations for the purposes of describing innovative aspects of this disclosure. However, a person having ordinary skill in the art will readily recognize that the teachings herein can be applied in a multitude of different ways. The described implementations can be implemented in any device, system or network that is capable of transmitting and receiving radio frequency (RF) signals according to one or more of the Institute of Electrical and Electronics Engineers (IEEE) 802.11 standards, the IEEE 802.15 standards, the Bluetooth® standards as defined by the Bluetooth Special Interest Group (SIG), or the Long Term Evolution (LTE), 3G, 4G or 5G (New Radio (NR)) standards promulgated by the 3rd Generation Partnership Project (3GPP), among others. The described implementations can be implemented in any device, system or network that is capable of transmitting and receiving RF signals according to one or more of the following technologies or techniques: code division multiple access (CDMA), time division multiple access (TDMA), frequency division multiple access (FDMA), orthogonal FDMA (OFDMA), single-carrier FDMA (SC-FDMA), single-user (SU) multiple-input multiple-output (MIMO) and multi-user (MU) MIMO. The described implementations also can be implemented using other wireless communication protocols or RF signals suitable for use in one or more of a wireless personal area network (WPAN), a wireless local area network (WLAN), a wireless wide area network (WWAN), or an internet of things (IOT) network.

Various implementations relate generally to the preamble design for EHT and beyond formats or wireless communication protocols. Some implementations more specifically relate to the use of a mark or marker symbol in a frame preamble that is placed after a legacy portion of a preamble and used to indicate, to a receiver of the frame, for example, the particular protocol. In some implementations, the mark symbol may include a particular signature field including a sequence of bits that indicate the particular protocol to a receiving device. In some other implementations, a cyclic redundancy check (CRC) field in the mark symbol may be manipulated or modified such that the protocol is indicated using a checksum of the CRC that is placed in the CRC field. The manipulation or modification of the CRC field may include concatenating the bits to be placed in the mark symbol with a predetermined number of additional bits identifying the protocol and then generating the checksum to be placed in the CRC field by preforming CRC on the concatenated bits. In other implementations, the manipulation or modification of the CRC field may include applying a CRC mask function to the bits to be placed in the mark symbol to thereby generate the checksum to be placed in the CRC field. In still other implementations, the CRC field may include a checksum that is known in advance of a transmission to both the transmitting and receiving devices. In some such implementations, the checksum may be set to a value that corresponds to a particular protocol.

Particular implementations of the subject matter described in this disclosure can be implemented to realize one or more of the following potential advantages. In some implementations, the described techniques can be used to facilitate the detection of EHT and beyond preambles, while also being able to coexist with legacy preambles without the need for additional hardware complexity.

FIG. 1 shows a block diagram of an example wireless communication network 100. According to some aspects, the wireless communication network 100 can be an example of a wireless local area network (WLAN) such as a Wi-Fi network (and will hereinafter be referred to as WLAN 100). For example, the WLAN 100 can be a network implementing at least one of the IEEE 802.11 family of wireless communication protocol standards (such as that defined by the IEEE 802.11-2016 specification or amendments thereof including, but not limited to, 802.11ah, 802.11ad, 802.11ay, 802.11ax, 802.11az, 802.11ba and 802.11be). The WLAN 100 may include numerous wireless communication devices such as an access point (AP) 102 and multiple stations (STAs) 104. While only one AP 102 is shown, the WLAN network 100 also can include multiple APs 102.

Each of the STAs 104 also may be referred to as a mobile station (MS), a mobile device, a mobile handset, a wireless handset, an access terminal (AT), a user equipment (UE), a subscriber station (SS), or a subscriber unit, among other possibilities. The STAs 104 may represent various devices such as mobile phones, personal digital assistant (PDAs), other handheld devices, netbooks, notebook computers, tablet computers, laptops, display devices (for example, TVs, computer monitors, navigation systems, among others), music or other audio or stereo devices, remote control devices ("remotes"), printers, kitchen or other household appliances, key fobs (for example, for passive keyless entry and start (PKES) systems), among other possibilities.

A single AP 102 and an associated set of STAs 104 may be referred to as a basic service set (BSS), which is managed by the respective AP 102. FIG. 1 additionally shows an example coverage area 106 of the AP 102, which may represent a basic service area (BSA) of the WLAN 100. The BSS may be identified to users by a service set identifier (SSID), as well as to other devices by a basic service set identifier (BSSID), which may be a medium access control (MAC) address of the AP 102. The AP 102 periodically broadcasts beacon frames ("beacons") including the BSSID to enable any STAs 104 within wireless range of the AP 102 to "associate" or re-associate with the AP 102 to establish a respective communication link 108 (hereinafter also referred to as a "Wi-Fi link"), or to maintain a communication link 108, with the AP 102. For example, the beacons can include an identification of a primary channel used by the respective AP 102 as well as a timing synchronization function for establishing or maintaining timing synchronization with the AP 102. The AP 102 may provide access to external networks to various STAs 104 in the WLAN via respective communication links 108.

To establish a communication link 108 with an AP 102, each of the STAs 104 is configured to perform passive or active scanning operations ("scans") on frequency channels in one or more frequency bands (for example, the 2.4 GHz, 5 GHz, 6 GHz or 60 GHz bands). To perform passive scanning, a STA 104 listens for beacons, which are transmitted by respective APs 102 at a periodic time interval referred to as the target beacon transmission time (TBTT) (measured in time units (TUs) where one TU may be equal to 1024 microseconds (μs)). To perform active scanning, a STA 104 generates and sequentially transmits probe requests on each channel to be scanned and listens for probe responses from APs 102. Each STA 104 may be configured to identify or select an AP 102 with which to associate based on the scanning information obtained through the passive or active scans, and to perform authentication and association operations to establish a communication link 108 with the selected AP 102. The AP 102 assigns an association identifier (AID) to the STA 104 at the culmination of the association operations, which the AP 102 uses to track the STA 104.

As a result of the increasing ubiquity of wireless networks, a STA 104 may have the opportunity to select one of many BSSs within range of the STA or to select among multiple APs 102 that together form an extended service set (ESS) including multiple connected BSSs. An extended network station associated with the WLAN 100 may be connected to a wired or wireless distribution system that may allow multiple APs 102 to be connected in such an ESS. As such, a STA 104 can be covered by more than one AP 102 and can associate with different APs 102 at different times for different transmissions. Additionally, after association with an AP 102, a STA 104 also may be configured to periodically scan its surroundings to find a more suitable AP 102 with which to associate. For example, a STA 104 that is moving relative to its associated AP 102 may perform a "roaming" scan to find another AP 102 having more desirable network characteristics such as a greater received signal strength indicator (RSSI) or a reduced traffic load.

In some cases, STAs 104 may form networks without APs 102 or other equipment other than the STAs 104 themselves. One example of such a network is an ad hoc network (or wireless ad hoc network). Ad hoc networks may alternatively be referred to as mesh networks or peer-to-peer (P2P) networks. In some cases, ad hoc networks may be implemented within a larger wireless network such as the WLAN 100. In such implementations, while the STAs 104 may be capable of communicating with each other through the AP 102 using communication links 108, STAs 104 also can communicate directly with each other via direct wireless links 110. Additionally, two STAs 104 may communicate via a direct communication link 110 regardless of whether both STAs 104 are associated with and served by the same AP 102. In such an ad hoc system, one or more of the STAs 104 may assume the role filled by the AP 102 in a BSS. Such a STA 104 may be referred to as a group owner (GO) and may coordinate transmissions within the ad hoc network. Examples of direct wireless links 110 include Wi-Fi Direct connections, connections established by using a Wi-Fi Tunneled Direct Link Setup (TDLS) link, and other P2P group connections.

The APs 102 and STAs 104 may function and communicate (via the respective communication links 108) according to the IEEE 802.11 family of wireless communication protocol standards (such as that defined by the IEEE 802.11-2016 specification or amendments thereof including, but not limited to, 802.11ah, 802.11ad, 802.11ay, 802.11ax, 802.11az, 802.11ba and 802.11be). These standards define the WLAN radio and baseband protocols for the PHY and medium access control (MAC) layers. The APs 102 and STAs 104 transmit and receive wireless communications (hereinafter also referred to as "Wi-Fi communications") to and from one another in the form of physical layer convergence protocol (PLCP) protocol data units (PPDUs). The APs 102 and STAs 104 in the WLAN 100 may transmit PPDUs over an unlicensed spectrum, which may be a portion of spectrum that includes frequency bands traditionally used by Wi-Fi technology, such as the 2.4 GHz band, the 5 GHz band, the 60 GHz band, the 3.6 GHz band, and the 900 MHz band. Some implementations of the APs 102 and STAs 104 described herein also may communicate in other frequency bands, such as the 6 GHz band, which may support both licensed and unlicensed communications. The APs 102 and STAs 104 also can be configured to communicate over other frequency bands such as shared licensed frequency bands, where multiple operators may have a license to operate in the same or overlapping frequency band or bands.

Each of the frequency bands may include multiple sub-bands or frequency channels. For example, PPDUs conforming to the IEEE 802.11n, 802.11ac, 802.11ax and 802.11be standard amendments may be transmitted over the 2.4, 5 GHz or 6 GHz bands, each of which is divided into multiple 20 MHz channels. As such, these PPDUs are transmitted over a physical channel having a minimum bandwidth of 20 MHz, but larger channels can be formed through channel bonding. For example, PPDUs may be transmitted over physical channels having bandwidths of 40 MHz, 80 MHz, 160 or 320 MHz by bonding together multiple 20 MHz channels.

Each PPDU is a composite structure that includes a PHY preamble and a payload in the form of a PLCP service data unit (PSDU). The information provided in the preamble may be used by a receiving device to decode the subsequent data in the PSDU. In instances in which PPDUs are transmitted over a bonded channel, the preamble fields may be duplicated and transmitted in each of the multiple component channels. The PHY preamble may include both a legacy portion (or "legacy preamble") and a non-legacy portion (or "non-legacy preamble"). The legacy preamble may be used for packet detection, automatic gain control and channel estimation, among other uses. The legacy preamble also may generally be used to maintain compatibility with legacy devices. The format of, coding of, and information provided in the non-legacy portion of the preamble is based on the particular IEEE 802.11 protocol to be used to transmit the payload.

APs and STAs that include multiple antennas may support various diversity schemes. For example, spatial diversity may be used by one or both of a transmitting device or a receiving device to increase the robustness of a transmission. For example, to implement a transmit diversity scheme, a transmitting device may transmit the same data redundantly over two or more antennas. APs and STAs that include multiple antennas may also support space-time block coding (STBC). With STBC, a transmitting device also transmits multiple copies of a data stream across a number of antennas to exploit the various received versions of the data to increase the likelihood of decoding the correct data. More specifically, the data stream to be transmitted is encoded in blocks, which are distributed among the spaced antennas and across time. Generally, STBC can be used when the number $N\_Tx$ of transmit antennas exceeds the number $N\_SS$ of spatial streams (described below). The $N\_SS$ spatial streams may be mapped to a number $N\_STS$ of space-time streams, which are then mapped to $N\_Tx$ transmit chains.

APs and STAs that include multiple antennas may also support spatial multiplexing, which may be used to increase the spectral efficiency and the resultant throughput of a transmission. To implement spatial multiplexing, the transmitting device divides the data stream into a number $N\_SS$ of separate, independent spatial streams. The spatial streams are then separately encoded and transmitted in parallel via the multiple $N\_Tx$ transmit antennas. If the transmitting device includes $N\_Tx$ transmit antennas and the receiving device includes $N\_Rx$ receive antennas, the maximum number $N\_SS$ of spatial streams that the transmitting device can simultaneously transmit to the receiving device is limited by the lesser of $N\_Tx$ and $N\_Rx$. In some implementations, the AP 102 and STAs 104 may be able to implement both transmit diversity as well as spatial multiplexing. For example, in instances in which the number $N\_SS$ of spatial streams is less than the number $N\_Tx$ of transmit antennas, the spatial streams may be multiplied by a spatial expansion matrix to achieve transmit diversity.

APs and STAs that include multiple antennas may also support beamforming. Beamforming refers to the focusing of the energy of a transmission in the direction of a target receiver. Beamforming may be used both in a single-user context, for example, to improve a signal-to-noise ratio (SNR), as well as in a multi-user (MU) context, for example, to enable MU multiple-input multiple-output (MIMO) (MU-MIMO) transmissions (also referred to as spatial division multiple access (SDMA)). To perform beamforming, a transmitting device, referred to as the beamformer, transmits a signal from each of multiple antennas. The beamformer configures the amplitudes and phase shifts between the signals transmitted from the different antennas such that the signals add constructively along particular directions towards the intended receiver, which is referred to as a beamformee. The manner in which the beamformer configures the amplitudes and phase shifts depends on channel state information (CSI) associated with the wireless channels over which the beamformer intends to communicate with the beamformee.

To obtain the CSI necessary for beamforming, the beamformer may perform a channel sounding procedure with the beamformee. For example, the beamformer may transmit one or more sounding signals (for example, in the form of a null data packet (NDP)) to the beamformee. The beamformee may then perform measurements for each of the $N\_Tx \times N\_Rx$ sub-channels corresponding to all of the transmit antenna and receive antenna pairs based on the sounding signal. The beamformee generates a feedback matrix based on the channel measurements and, typically, compresses the feedback matrix before transmitting the feedback to the beamformer. The beamformer may then generate a precoding (or "steering") matrix for the beamformee based on the feedback and use the steering matrix to precode the data streams to configure the amplitudes and phase shifts for subsequent transmissions to the beamformee.

As described above, a transmitting device may support the use of diversity schemes. When performing beamforming, the transmitting beamforming array gain is logarithmically proportional to the ratio of $N\_Tx$ to $N\_SS$. As such, it is generally desirable, within other constraints, to increase the number $N\_Tx$ of transmit antennas when performing beamforming to increase the gain. It is also possible to more accurately direct transmissions by increasing the number of transmit antennas. This is especially advantageous in MU transmission contexts in which it is particularly important to reduce inter-user interference.

As described above, APs 102 and STAs 104 can support multi-user (MU) communications; that is, concurrent transmissions from one device to each of multiple devices (for example, multiple simultaneous downlink (DL) communications from an AP 102 to corresponding STAs 104), or concurrent transmissions from multiple devices to a single device (for example, multiple simultaneous uplink (UL) transmissions from corresponding STAs 104 to an AP 102). To support the MU transmissions, the APs 102 and STAs 104 may utilize multi-user multiple-input, multiple-output (MU-MIMO) and multi-user orthogonal frequency division multiple access (MU-OFDMA) techniques.

In MU-OFDMA schemes, the available frequency spectrum of the wireless channel may be divided into multiple resource units (RUs) each including a number of different frequency subcarriers ("tones"). Different RUs may be allocated or assigned by an AP 102 to different STAs 104 at particular times. The sizes and distributions of the RUs may be referred to as an RU allocation. In some implementations, RUs may be allocated in 2 MHz intervals, and as such, the smallest RU may include 26 tones consisting of 24 data tones and 2 pilot tones. Consequently, in a 20 MHz channel, up to 9 RUs (such as 2 MHz, 26-tone RUs) may be allocated (because some tones are reserved for other purposes). Similarly, in a 160 MHz channel, up to 74 RUs may be allocated. Larger 52 tone, 106 tone, 242 tone, 484 tone and 996 tone RUs may also be allocated. Adjacent RUs may be separated by a null subcarrier (such as a DC subcarrier), for example, to reduce interference between adjacent RUs, to reduce receiver DC offset, and to avoid transmit center frequency leakage.

For UL MU transmissions, an AP 102 can transmit a trigger frame to initiate and synchronize an UL MU-OFDMA or UL MU-MIMO transmission from multiple STAs 104 to the AP 102. Such trigger frames may thus enable multiple STAs 104 to send UL traffic to the AP 102 concurrently in time. A trigger frame may address one or more STAs 104 through respective association identifiers (AIDs), and may assign each AID (and thus each STA 104) one or more RUs that can be used to send UL traffic to the AP 102. The AP also may designate one or more random access (RA) RUs that unscheduled STAs 104 may contend for.

Figure 2B:
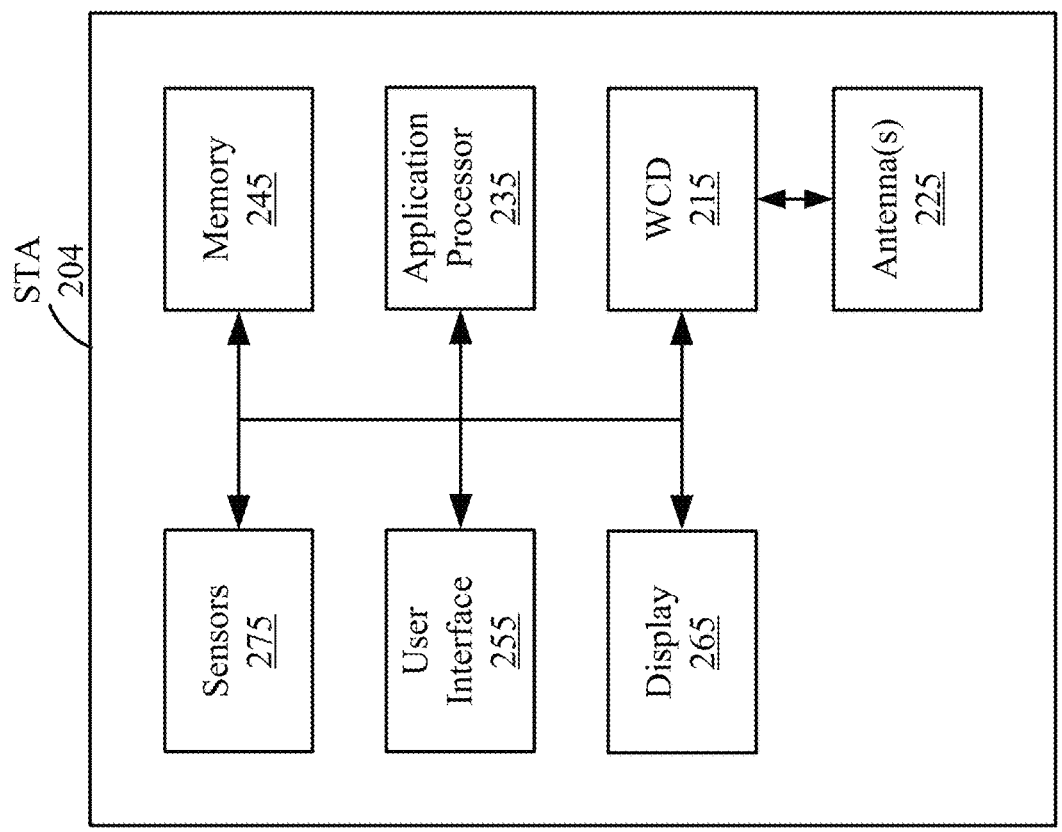
FIG. 2B shows a block diagram of an example station in accordance with some aspects of the present disclosure.
Figure 2A:
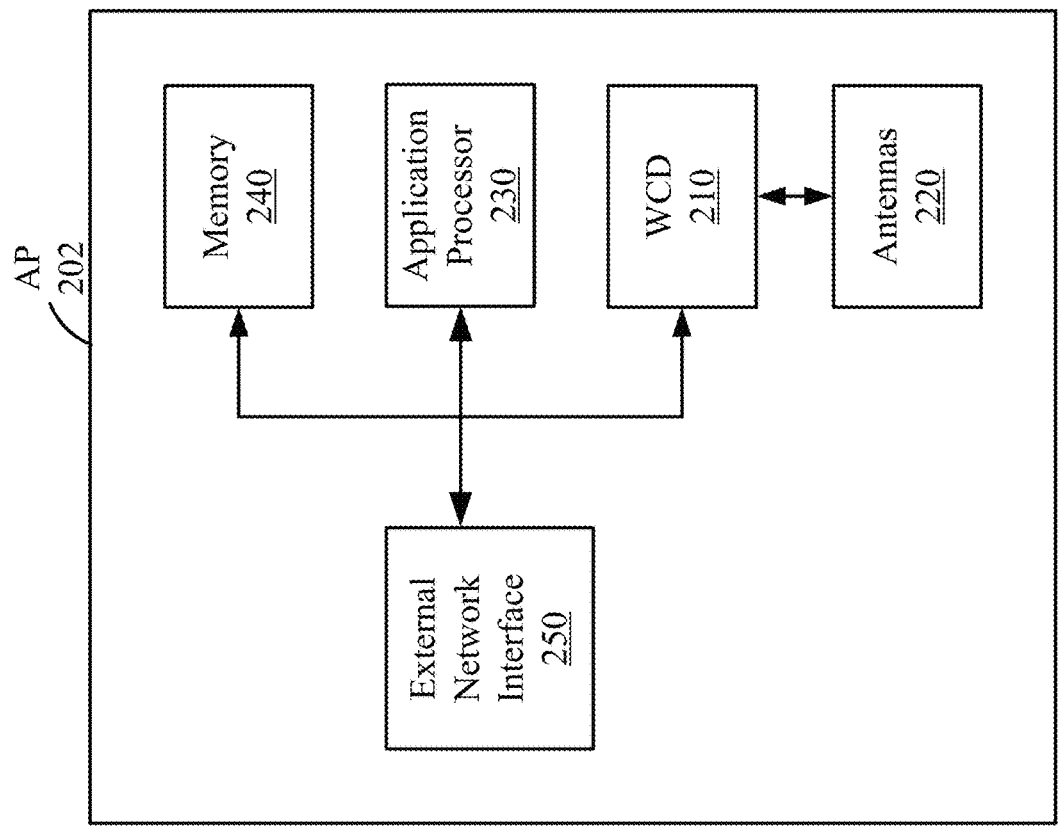
FIG. 2A is a block diagram of an example access point in accordance with some aspects of the present disclosure.

FIG. 2A shows a block diagram of an example AP 202. For example, the AP 202 can be an example implementation of the AP 102 described with reference to FIG. 1. The AP 202 includes a wireless communication device (WCD) 210 (although the AP 202 may itself also be referred to generally as a wireless communication device as used herein). For example, the wireless communication device 210 may be an example implementation of the wireless communication device 1800, which will be described later with reference to FIG. 18. The AP 202 also includes multiple antennas 220 coupled with the wireless communication device 210 to transmit and receive wireless communications. In some implementations, the AP 202 additionally includes an application processor 230 coupled with the wireless communication device 210, and a memory 240 coupled with the application processor 230. The AP 202 further includes at least one external network interface 250 that enables the AP 202 to communicate with a core network or backhaul network to gain access to external networks including the Internet. For example, the external network interface 250 may include one or both of a wired (for example, Ethernet) network interface and a wireless network interface (such as a WWAN interface). Ones of the aforementioned components can communicate with other ones of the components directly or indirectly, over at least one bus. The AP 202 further includes a housing that encompasses the wireless communication device 210, the application processor 230, the memory 240, and at least portions of the antennas 220 and external network interface 250.

FIG. 2B shows a block diagram of an example STA 204. For example, the STA 204 can be an example implementation of the STA 104 described with reference to FIG. 1. The STA 204 includes a wireless communication device 215 (although the STA 204 may itself also be referred to generally as a wireless communication device as used herein). For example, the wireless communication device 215 may be an example implementation of the wireless communication device 1800, which will be described later with reference to FIG. 18. The STA 204 also includes one or more antennas 225 coupled with the wireless communication device 215 to transmit and receive wireless communications. The STA 204 additionally includes an application processor 235 coupled with the wireless communication device 215, and a memory 245 coupled with the application processor 235. In some implementations, the STA 204 further includes a user interface (UI) 255 (such as a touchscreen or keypad) and a display 265, which may be integrated with the UI 255 to form a touchscreen display. In some implementations, the STA 204 may further include one or more sensors 275 such as, for example, one or more inertial sensors, accelerometers, temperature sensors, pressure sensors, or altitude sensors. Ones of the aforementioned components can communicate with other ones of the components directly or indirectly, over at least one bus. The STA 204 further includes a housing that encompasses the wireless communication device 215, the application processor 235, the memory 245, and at least portions of the antennas 225, UI 255, and display 265.

Figure 3:
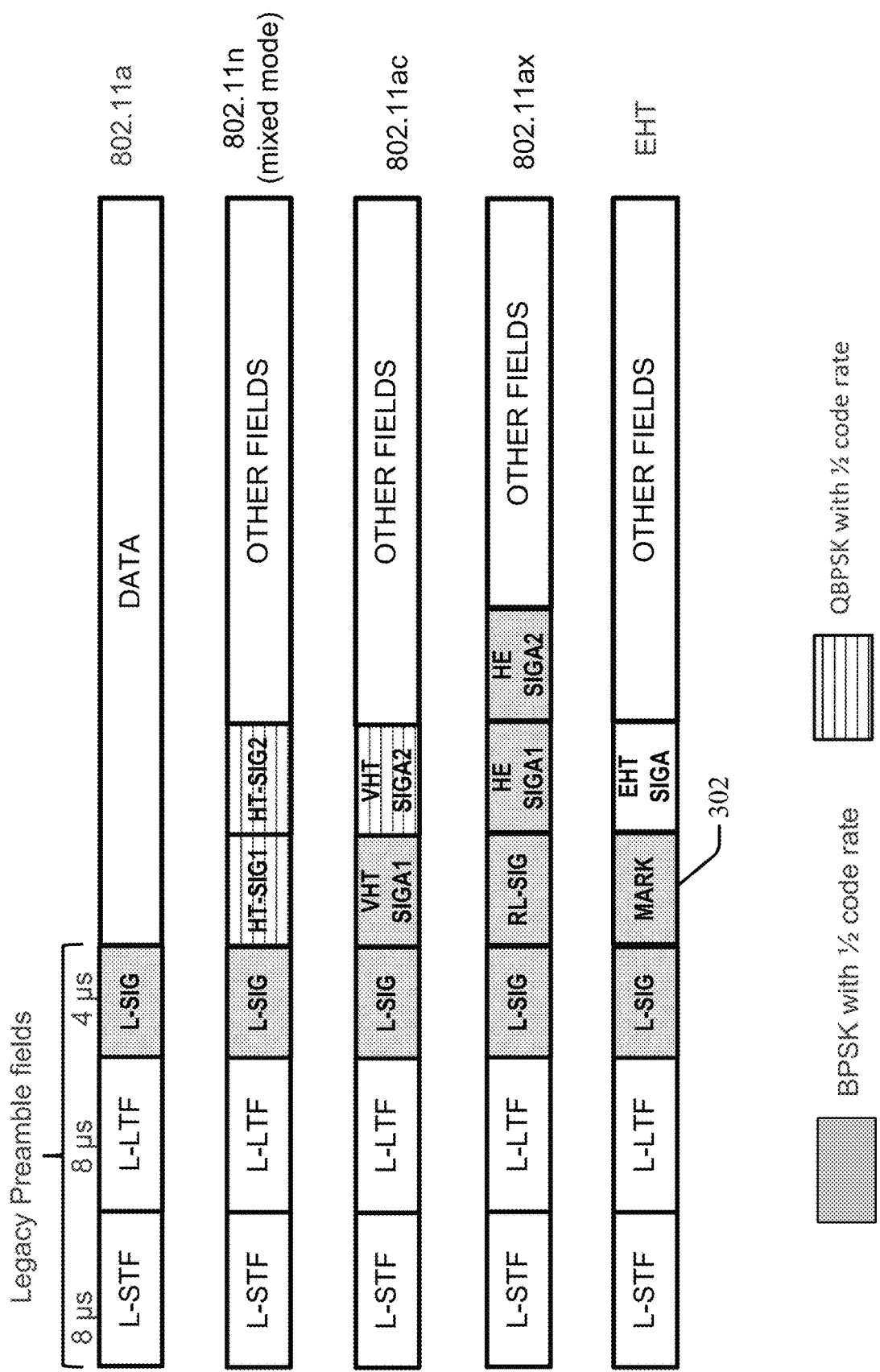
FIG. 3 shows examples of packets associated with various protocols in accordance with some aspects of the present disclosure.

FIG. 3 illustrates packets for various protocols in the IEEE 802.11 family of protocols (also referred to as standards, specifications, amendments, generations, extensions, etc.). The illustrated exemplary protocols in FIG. 3 are IEEE 802.11a, 802.11n (mixed mode), 802.11ac, 802.11ax, and extreme high throughput (EHT). As shown in FIG. 3, while the preambles for each of the protocols is different, the start of each preamble contains common legacy fields including a legacy short training field (L-STF), a legacy long training field (L-LTF), and a legacy signal (L-SIG) field. Further, it is noted that each legacy signal (L-SIG) field may be BPSK modulated at a half code rate as indicated by shading within the L-SIG fields.

Concerning the differences, the preamble for 802.11ax, for example, includes a repeat legacy signal (RL-SIG) field that is a repeat of the legacy signal (L-SIG) field, while the preambles for the other protocols do not include the RL-SIG field. In another example, the preambles for 802.11n, 802.11ac, 802.11ax and EHT include different signal fields (i.e., HT SIG1 and HT SIG2 for 802.11n, VHT SIG1 and VHT SIG2 for 802.11ac, HE SIGA1 and HE SIGA2 for 802.11ax and EHT SIGA for EHT, where HT stands for high throughout, VHT stands for very high throughput, and HE stands for high efficiency).

For each 802.11 protocol developed so far, a significant amount of time has been spent on the design of the preamble, detection of the preamble with low false-alarm probability, and co-existence with previous protocols. As more 802.11 protocols have been added, 802.11 preamble detection has become complicated and burdensome for hardware. Accordingly, there is desire to reduce the amount of time spent defining a new preamble for each forthcoming 802.11 protocol along with refraining from introducing additional complexity to hardware for signal detection.

When a receiving node (e.g., AP 202 or STA 204) starts receiving a packet, the receiving node needs to detect the preamble of the packet in order receive and decode the remainder of the packet. To do this, the receiving node determines the protocol of the packet. By determining the protocol of the packet, the receiving node is able to determine the structure (i.e., format) of the preamble of the packet since the preamble structure for each protocol is predefined. This allows the receiving node to properly process the preamble of the packet and recover the data in the packet.

Currently, a receiving node determines the protocol of a packet by performing a rotation check and/or looking for an RL-SIG field in the packet. For example, as discussed above, the RL-SIG field in an 802.11ax packet is a repeat of the L-SIG field. Thus, in this example, the receiving node can detect an 802.11ax packet by looking for a repeat of the L-SIG field (i.e., the RL-SIG field). In another example, a B2 reserved bit in the VHT SIGA field of an 802.11ac packet is set to one while the B2 bit in the RL-SIG field of an 802.11ax packet is set to 0. Thus, in this example, the receiving node may distinguish between an 802.11ac packet and an 802.11ax packet by determining whether the B2 bit is set to zero or one. Setting the B2 bit to one for 802.11ac and zero for 802.11ax reduces the likelihood that the VHT will be falsely detected as HE.

In some aspects of the present disclosure, the RL-SIG field in the 802.11ax protocol is replaced with a mark symbol, stamp, or signature field 302 (also referred to herein simply as a "mark symbol", "mark symbol", or "mark") for EHT and future protocols. The mark symbol 302 facilitates preamble detection by indicating the protocol of the packet, as will be discussed further below. According to an aspect, the Mark symbol 302 or symbol may have a fast Fourier transform (FFT) size of 64. In another aspect, the Mark symbol may be an OFDM symbol transmitted over 56 subcarriers (also referred to as tones). The 56 subcarriers may include 48 data subcarriers, four pilot subcarriers and four extra augmented long training field (LTF) subcarriers. The Mark symbol 302 may also be BPSK modulated (6 Mb/s) with a ½ code rate per 20 MHz PPDU or channel as illustrated by shading in FIG. 3.

The Mark symbol 302 may be encoded, interleaved, have pilot insertion and mapping similar to an L-SIG OFDM symbol. In a further aspect, the Mark symbol 302 may have 24 bits that spans over subcarriers [−26, 26]. Additional values [−1, −1, −1, 1] may be mapped to extra subcarriers [−28, −27, 27, 28] of the Mark symbol for channel estimation of the extra subcarriers used in EHT SIGA. The extra subcarriers [−28, −27, 27, 28] may also be BPSK modulated. In some aspects, the Mark contents are not scrambled.

According to further aspects, the Mark symbol includes a signature that identifies the protocol (e.g., and EHT signature) of the packet (also referred to as a frame). The signature helps a wireless node receiving the packet determine the protocol of the packet, as discussed further below. As used herein, the term "signature" may refer to a value (e.g., numerical value, sequence of bits, etc.) that is assigned to the protocol for identifying the protocol.

In this regard, FIG. 4 shows an example of the contents of the Mark symbol (i.e., field 302 in FIG. 3) according to some aspects. In this example, the Mark symbol includes a stamp or signature 410 field for identifying the protocol (e.g., EHT) of the packet, a reserved bit 420 set to one, a field reserved for other information 430, a cyclic redundancy check (CRC) field 440 that carries a CRC checksum, and a tail 450 that may be set to zero. In the example shown in FIG. 4, the signature 410 comprises four bits, the other information 430 comprises nine bits, the checksum 440 comprises four bits, and the tail 450 comprises six bits. However, it is to be appreciated that the signature 410, the other information 430, the checksum 440 and the tail 450 may comprise different numbers of bits than shown in the example in FIG. 4. The exemplary contents shown in FIG. 4 comprise a total of 24 bits, which may be transmitted in the Mark symbol over the subcarriers [−26, 26] discussed above.

In some aspects, the signature 410 has a value that uniquely identifies the protocol of the packet. For example, if the protocol of the packet is EHT, then the signature 410 has a value that is unique to EHT (i.e., a value assigned to EHT). In this example, the value assigned to EHT is predefined and known by both the transmitting node and the receiving node. When the receiving node receives a packet from the transmitting node, the receiving node retrieves the signature 410 from the Mark symbol of the packet, and determines that the packet is an EHT packet if the value of the signature 410 matches the value assigned to EHT. If the receiving node determines that the packet is not an EHT packet (i.e., no signature value matching the value assigned to EHT), then the receiving node may look for a repeat of the L-SIG field and/or perform a rotation check to determine whether the packet belongs to one of the legacy protocols discussed above (e.g., 802.11ax, 802.11ac, etc.).

In some aspects, the signature 410 comprises a sequence of bits in which the value of the signature 410 corresponds to a unique sequence of bit values. In the example in FIG. 4, the signature 410 may comprise four bits, corresponding to 16 possible values for the signature 410. However, it is to be understood that the signature 410 is not limited to the example of four bits, and may comprise a different number of bits.

In some aspects, each one of multiple protocols (e.g., EHT and future protocols) may be assigned a respective one of a plurality of values. In this regard, FIG. 5 shows an exemplary table 510, in which each one of multiple protocols (labeled Protocol$_1$ to Protocol$_L$) is assigned a respective one of a plurality of values (labeled Value$_1$ to Value$_L$). For the example in which the signature 410 comprises a sequence of bits, each of the values (i.e., Value$_1$ to Value$_L$) in table 510 corresponds to a different sequence of bit values. In one example, the first protocol in table 510 (i.e., Protocol$_1$ shown at 520) corresponds to EHT, and each of the other protocols (i.e., Protocol$_2$ to Protocol$_L$ shown as 530, intermediate protocols 3 through L−1 at 540, and 550) corresponds to a future protocol. Thus, in this example, the signature 410 may be extended to identify future protocols. The transmitting node and receiving node may each store a local copy of the table 510.

In this example, when the transmitting node generates a packet, the transmitting node inserts the value assigned to the protocol of the packet in the stamp/signature field 410 of the Mark symbol. The transmitting node then transmits the packet. The receiving node receives at least a portion of the packet, retrieves the value of the signature 410 in the Mark symbol of the packet, and determines the protocol of the packet based on the retrieved value. For example, the receiving node may determine the protocol by determining the protocol in table 510 that corresponds (i.e., maps) to the retrieved value. For example, if the retrieved value is Value$_1$, then the receiving node may determine that the packet belongs to Protocol$_1$. If the retrieved value is Value$_2$, then the receiving node may determine that the packet belongs to Protocol$_2$, and so forth. The number of protocols that the signature 410 can be used to identify depends on the length of the signature 410. For example, if the signature 410 comprises four bits, then the signature 410 may be used to identify up to 16 different protocols.

As discussed above, the Mark symbol in the example in FIG. 4 includes a reserved bit 420 set to one. The reserved bit 420 may be located in bit position "B2" in the Mark symbol. In this example, the reserved bit 420 helps distinguish an EHT packet from an HE packet. This is because the B2 bit in the RL-SIG field of an HE packet is set to zero. Thus, setting the B2 bit in the Mark symbol of a packet to one distinguishes the packet from an HE packet. In this example, the packet may be an EHT packet or a packet belonging to a future protocol.

As discussed above, the Mark symbol in the example in FIG. 4 includes other information 430. Examples of types of information that may be included as part of the other information 430 are discussed further below.

Figure 6A:
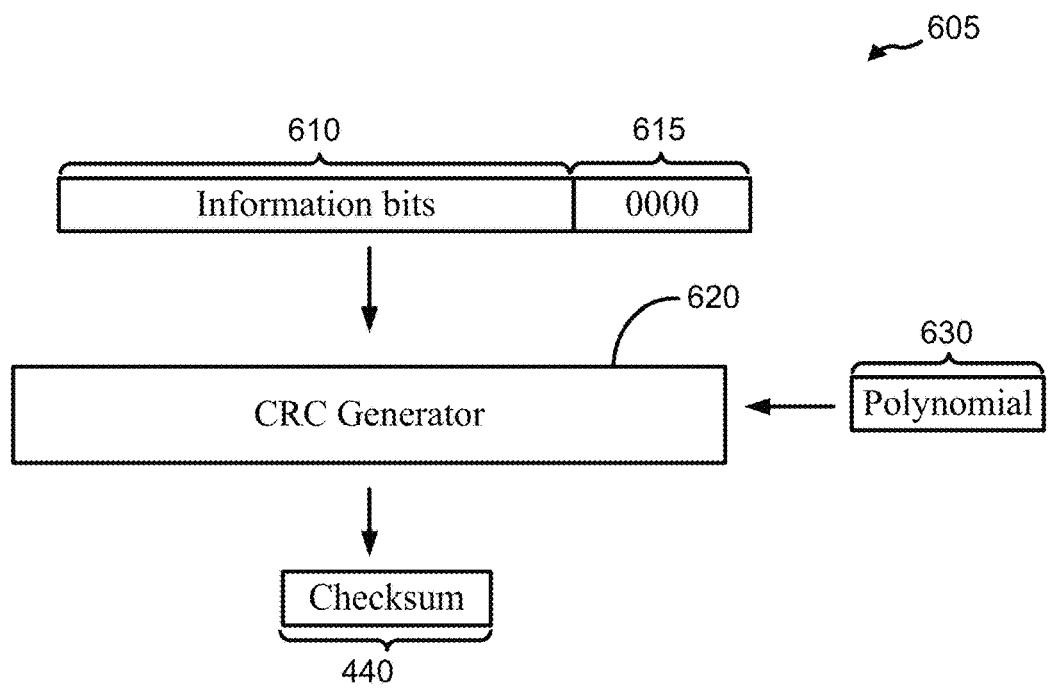
FIG. 6A illustrates an example of a process for generating a checksum in accordance with some aspects of the present disclosure.
Figure 6B:
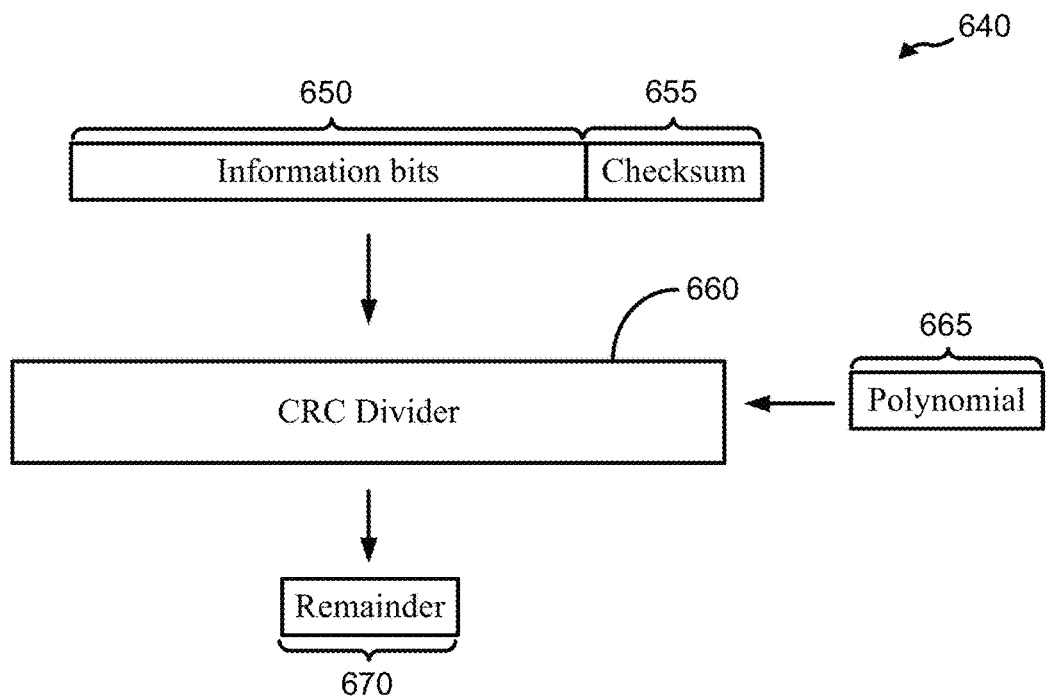
FIG. 6B illustrates an example of a process for detecting an error using the checksum in accordance with some aspects of the present disclosure.

Still further as discussed above, the Mark symbol in FIG. 4 includes a CRC field 440 containing a checksum. The checksum in field 440 may be used for detecting errors in the Mark symbol received at the receiving node. In this regard, FIG. 6A illustrates an exemplary process 605 for generating the checksum for the CRC field 440 at the transmitting node (e.g., AP 202 or STA 204). FIG. 6B illustrates an exemplary process 640 for detecting an error at the receiving node (e.g., AP 202 or STA 204) using the checksum.

Referring to FIG. 6A, at the transmitting node, information bits 610 to be transmitted in the Mark symbol are input to a CRC generator 620 to generate the checksum 440. The information bits 610 may include the signature 410, the reserved bit 420, and the other information 430 shown in FIG. 4. Before the information bits 610 are input to the CRC generator 620, a sequence of zero bits 615 may be appended to the information bits 610, as shown in FIG. 6A. In one example, the number of zero bits 615 appended to the information bits 610 is equal to the number of bits in the checksum 440. In this example, if the CRC checksum (note: FIG. 6A is repeating the designated reference number 440 to refer to the CRC checksum for ease of reference as this CRC checksum is the checksum in CRC field 440 in FIG. 4) comprises n bits, then n zero bits 615 are appended to the information bits 610, where n is an integer. In the example shown in FIG. 6A, n equals four. However, it is to be understood that the present disclosure is not limited to this example, and that n may have a different value (e.g., n=8).

The CRC generator 620 then generates the CRC checksum 440 using polynomial division, in which the CRC generator 620 divides the information bits 610 with the appended zero bits 615 by a polynomial 630. The CRC generator 620 outputs the remainder of the polynomial division as the CRC checksum 440. Thus, in this example, the CRC checksum 440 is the remainder of the polynomial division. The polynomial 630 is predefined and known by both the transmitting node and the receiving node, as discussed further below. The polynomial 630 may also be referred to as a CRC polynomial string, or another term. The polynomial 630 may comprise a binary polynomial, in which each coefficient of the binary polynomial is either 0 or 1. The CRC checksum 440 may also be referred to as a CRC value, or another term.

After the CRC checksum 440 is generated, the transmitting node includes the CRC checksum 440 in the Mark symbol, as shown in FIG. 4. The transmitting node then transmits the information bits 610 and the CRC checksum 440 in the Mark symbol 320 of a packet.

Referring to FIG. 6B, this drawing illustrates the receiving node receiving at least a portion of the packet from the transmitting node, and retrieving the information bits 650 and the checksum 655 from the Mark symbol 320 of the packet. If there are no errors in the received Mark symbol, then the received information bits 650 are known to be the same as the information bits 610 at the transmitting node, and the received checksum 655 is the same as the CRC checksum 440 at the transmitting node. The received information bits 650 and checksum 655 are input to a CRC divider 660, in which the checksum 655 is appended to the information bits 650. The CRC divider 660 divides the information bits 650 and the checksum 655 by the polynomial 665, and outputs the remainder 670 of the division. The polynomial 665 is the same as the polynomial 630 used at the transmitting node to generate the CRC checksum 440. In this regard, the transmitting node and the receiving node may each have a local copy of the polynomial. The receiving node then checks the remainder 670 to determine whether the information bits 650 were received in error. If the remainder 670 is equal to zero, then the receiving node determines there are no errors in the received information bits 650. If, on the other hand, the remainder 670 is non-zero, then the receiving node determines the information bits 650 were received in error. The remainder 670 may comprise multiple bits, in which the remainder 670 is equal to zero when all the bits are zero, and the remainder 670 is non-zero when at least one of the bits is one.

In some aspects, the CRC checksum in the Mark symbol may be manipulated, modified, configured, or adapted such that the CRC checksum is used to indicate the protocol of the packet instead of a stamp/signature in the Mark symbol. In these aspects, the signature 410 discussed above in connection with FIG. 4 may be omitted from the Mark symbol since the CRC checksum may be used to indicate the protocol of the packet, as discussed further below. An advantage of these aspects is that the space occupied by the signature 410 in FIG. 4 is freed up for other purposes (e.g., extend the length of the other information and/or the checksum).

In this regard, FIG. 7 shows an example of the Mark symbol or symbol, in which the Mark symbol does not include the signature 410 as was shown in the Mark symbol of FIG. 4. In this example, the Mark symbol includes a reserved field 720 including a single bit that is set to one, another information field 730 containing information bits, a CRC checksum field 740 include a CRC checksum, and a tail field 750 that may include bits set to zero in one example. In the example shown in FIG. 7, the other information field 730 comprises nine bits or thirteen bits, the CRC checksum field 740 comprises four bits or eight bits, and the tail field 750 comprises six bits. However, it is to be appreciated that the other information 730, the CRC checksum 740 and the tail 750 may comprise different numbers of bits than shown in the example in FIG. 7. The exemplary contents shown in FIG. 7 comprise a total of 24 bits, which may be transmitted in the Mark symbol over the subcarriers [−26, 26] discussed above.

The reserved bit 720 may be located in bit position B2 in the Mark symbol and set to one in order to distinguish the packet from an HE packet, as discussed above. Examples of types of information that may be included as part of the other information field 730 are discussed further below.

Figure 8A:
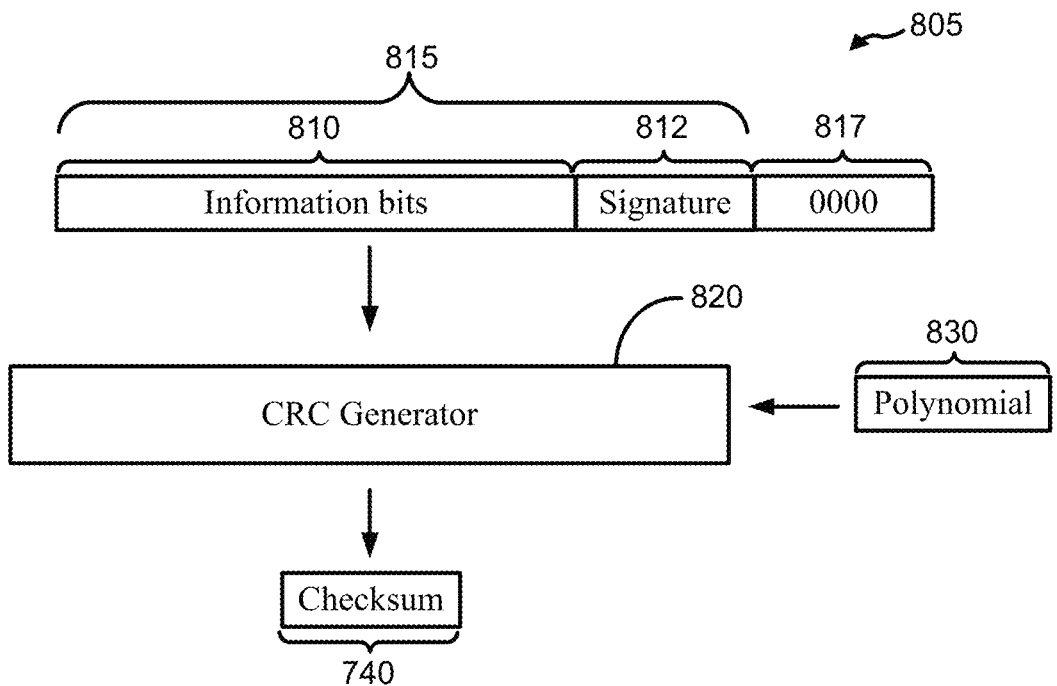
FIG. 8A illustrates an example of a process for manipulating a checksum to indicate a protocol in accordance with some aspects of the present disclosure.
Figure 8B:
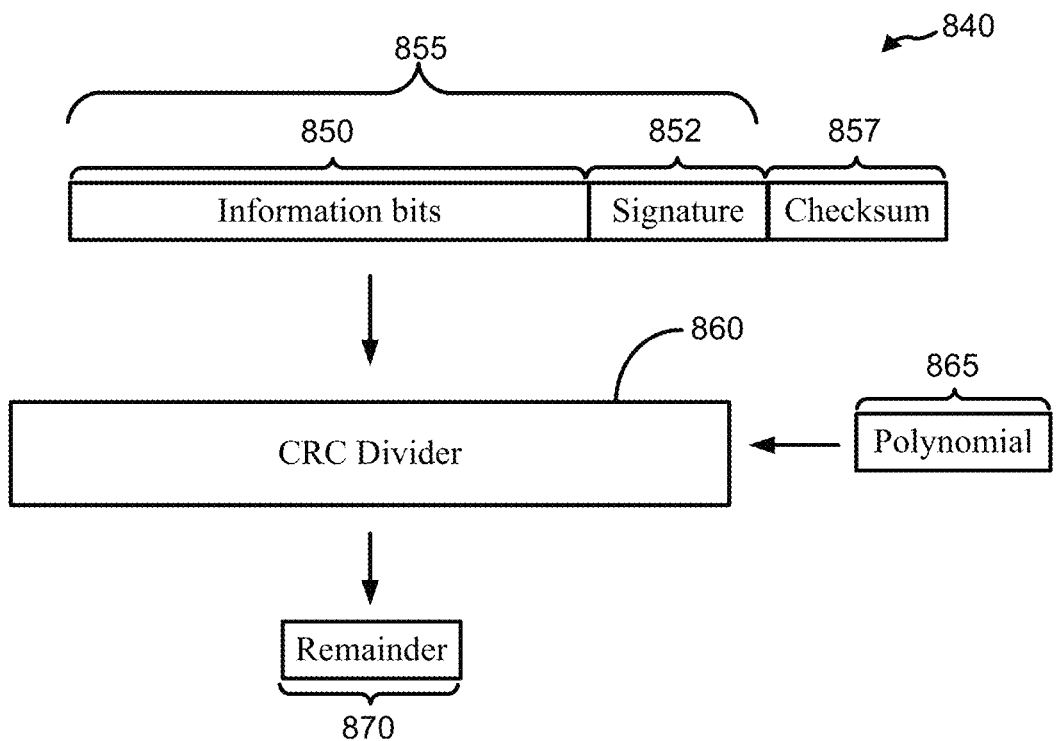
FIG. 8B illustrates an example of a process for determining the protocol of a packet using the checksum in accordance with some aspects of the present disclosure.

As discussed above, the CRC checksum 740 may be manipulated or adapted to indicate the protocol of the packet. In this regard, FIG. 8A illustrates an exemplary process 805 for manipulating the CRC checksum 740 at the transmitting node (e.g., AP 202 or STA 204) to indicate the protocol of the packet. FIG. 8B illustrates an exemplary process 840 for determining the protocol of the packet at the receiving node (e.g., AP 202 or STA 204) using the CRC checksum 740.

Referring to FIG. 8A, at the transmitting node, a signature 812 identifying the protocol of the packet is concatenated with information bits 810 to generate a combined bit sequence 815. The signature 812 may be concatenated with the information bits 810 by either appending or prepending the signature 812 to the information bits 810. FIG. 8A shows an example in which the signature 812 is appended to the information bits 810. As discussed further below, the signature 812 is used to generate the checksum 740, but is not transmitted as part of the Mark symbol. The signature 812 may comprise a sequence of bits that is unique to the protocol of the packet. The information bits 810 may include the reserved bit 720, and the other information 730 shown in FIG. 7.

The combined bit sequence 815 is input to a CRC generator 820 to generate the checksum 740. Before the combined bit sequence 815 is input to the CRC generator 820, a sequence of zero bits 817 may be appended to the combined bit sequence 815, as shown in FIG. 8A. In one example, the number of zero bits 817 appended to the combined bit sequence 815 is equal to the number of bits in the checksum 740.

The CRC generator 820 then generates the checksum 835 using polynomial division, in which the CRC generator 820 divides the combined bit sequence 815 with the appended zero bits 817 by a polynomial 830. The CRC generator 820 outputs the remainder of the polynomial division as the checksum 740. Thus, in this example, the checksum 740 is the remainder of the polynomial division. The polynomial 830 is predefined and known by both the transmitting node and the receiving node, as discussed further below. The polynomial 830 may comprise a binary polynomial, in which each coefficient of the binary polynomial is either 0 or 1.

After the checksum 740 is generated, the transmitting node includes the checksum 740 in the Mark symbol, as shown in FIG. 7. The transmitting node transmits the checksum 740 and the information bits 810 as part of the Mark symbol, but does not transmit the signature 812 as part of the Mark symbol. As discussed further below, the signature is predetermined and known a priori by the receiving node.

Since the checksum 740 is generated using the signature 812, the checksum 740 can be used at the receiving node to detect the protocol of the packet, as discussed further below.

Referring to FIG. 8B, the illustrated process 840 shows that the receiving node receives at least a portion of the packet transmitted from the transmitting node, and retrieves the information bits 850 and the checksum 857 from the Mark symbol of the packet. If there are no errors in the received Mark symbol, then the received information bits 850 are the same as the information bits 810 at the transmitting node, and the received checksum 857 is the same as the checksum 740 at the transmitting node.

The receiving node then concatenates a signature 852 with the received information bits 850 to generate a combined bit sequence 855. The signature 852 may be concatenated with the received information bits 850 be either appending or prepending the signature 852 to the received information bits 850. FIG. 8B shows an example in which the signature 852 is appended to the information bits 850. The signature 852 at the receiving node may have the same value as the signature 812 used at the transmitting node to generate the checksum 740. For example, the signature 852 at the receiving node and the signature 812 at the transmitting node may each have the value assigned to EHT, in which case the signatures 852 and 812 identify an EHT packet. In this example, the value assigned to EHT is predefined and known by both the receiving node and the transmitting node (i.e., the receiving node and the transmitting node each have a local copy of the value assigned to EHT).

The combined bit sequence 855 and checksum 857 are input to a CRC divider 860, in which the checksum 857 is appended to the combined bit sequence 855. The CRC divider 860 divides the combined bit sequence 855 and the checksum 857 by the polynomial 865, and outputs the remainder 870 of the division. The polynomial 865 is the same as the polynomial 830 used at the transmitting node to generate the checksum 740. In this regard, the transmitting node and the receiving node may each have a local copy of the polynomial.

The receiving node then checks the remainder 870 to determine whether the protocol of the packet is the protocol identified by the signature 852. If the remainder 870 is equal to zero, then the receiving node determines the protocol of the packet is the protocol identified by the signature 852. For example, if the signature 812 at the transmitting node and the signature 852 at the receiving node both have the value assigned to EHT and the received Mark symbol is error-free, then the receiving node determines that the received packet is an EHT packet.

If, on the other hand, the remainder 870 is non-zero, then the receiving node determines the protocol of the packet is not the protocol identified by the signature 852. This may occur if the received Mark symbol has one or more bits in error. This may also occur if the signature 812 at the transmitting node is different from the signature 852 at the receiving node, in which case the signature 812 at the transmitting node identifies a different protocol than the signature 852 at the receiving node.

In some aspects, each one of multiple protocols (e.g., EHT and future protocols) may be assigned a respective one of a plurality of values. In this regard, FIG. 9 shows an exemplary table 910, in which each one of multiple protocols (labeled $Protocol_1$ to $Protocol_L$) is assigned a respective one of a plurality of signature values (labeled $Signature\ Value_1$ to $Signature\ Value_L$). For the example in which a signature comprises a sequence of bits, each of the signature values (i.e., $Signature\ Value_1$ to $Value_L$) in table 910 corresponds to a different sequence of bit values. In one example, the first protocol in table 910 (i.e., $Protocol_1$) corresponds to EHT, and each of the other protocols (i.e., $Protocol_2$ to $Protocol_L$) corresponds to a future protocol. The transmitting node and receiving node may each store a local copy of table 910.

In this example, when the transmitting node generates a packet, the transmitting node gives the signature 812 the value assigned to the protocol of the packet. For example, if the protocol of the packet is $Protocol_1$ in table 910, then the transmitting node uses $Signature\ Value_1$ for the signature 812 to generate the checksum 740. The transmitting node then transmits the checksum 740 and the information bits 810 as part of the Mark symbol of the packet, but not the signature 812.

The receiving node receives at least a portion of the packet, and retrieves the information bits 850 and checksum 857 from the received packet. The receiving node may then perform the process 840 illustrated in FIG. 8B one or more times to determine the protocol of the packet. Each time the receiving node performs the process 840, the receiving node uses a different one of the values ($Signature\ Value_1$ to $Signature\ Value_L$) for the signature 852 to compute the remainder 870. In this example, when a value results in the remainder 870 equaling zero, the receiving node determines that the protocol of the packet is the protocol in table 910 corresponding to the value resulting in the remainder 870 equaling zero. Thus, the receiving node may determine the protocol of the packet by trying different values for the signature 852 to determine a value that results in the remainder 870 equaling zero, and determining the protocol in table 910 that corresponds (i.e., maps) to the determined value.

In some aspects, the checksum 740 may be manipulated or modified to indicate the protocol of the packet through masking the checksum at the transmitting node and unmasking the checksum at the receiving node based on the protocol, as discussed further below with reference to FIGS. 10A and 10B.

Figure 10A:
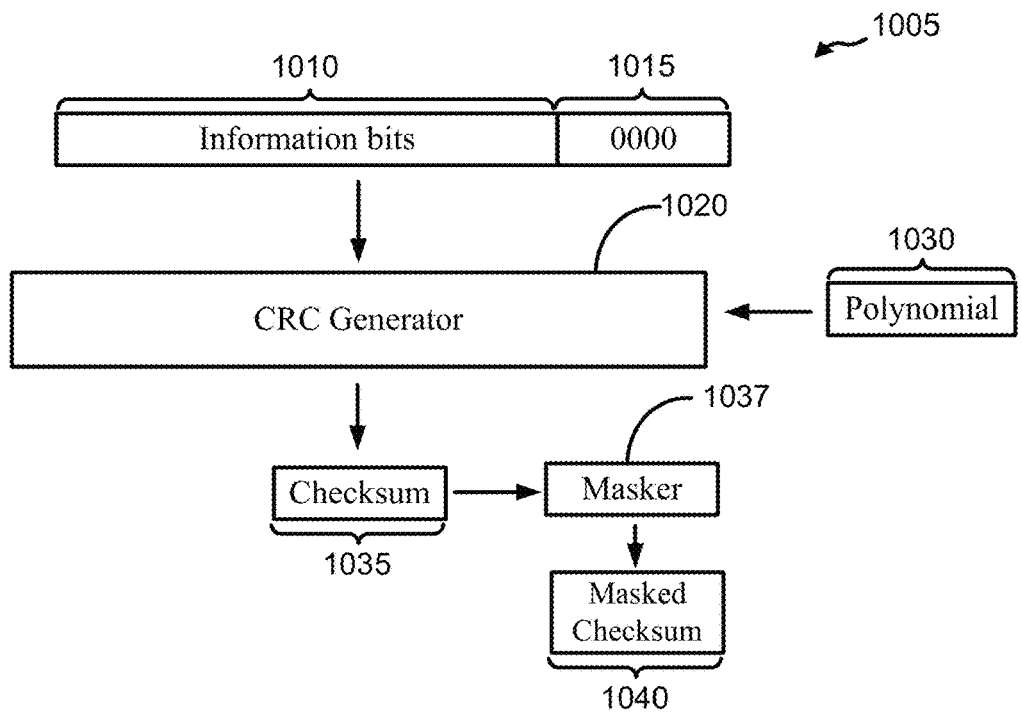
FIG. 10A illustrates another example of a process for manipulating a checksum to indicate a protocol in accordance with some aspects of the present disclosure.

Referring to FIG. 10A, at the transmitting node, information bits 1010 to be transmitted in the Mark symbol are input to a CRC generator 1020 to generate a CRC checksum 1035. Before the information bits 1010 are input to the CRC generator 1020, a sequence of zero bits 1015 may be appended to the information bits 1010, as shown in FIG. 10A. In one example, the number of zero bits 1015 appended to the information bits 1010 is equal to the number of bits in the checksum 1035. The information bits 1010 may include the reserved bit 720 and the other information 730 shown in FIG. 7, for example.

In some aspects, the CRC generator 1020 generates the checksum 1035 using polynomial division, in which the CRC generator 1020 divides the information bits 1010 with the appended zero bits 1015 by a polynomial 1030. The CRC generator 1020 outputs the remainder of the polynomial division as the checksum 1035. Thus, in this example, the checksum 1035 is the remainder of the polynomial division. The polynomial 1030 is predefined and known by both the transmitting node and the receiving node, as discussed further below. The polynomial 1030 may comprise a binary polynomial, in which each coefficient of the binary polynomial is either 0 or 1.

The checksum 1035 is then input to a masker 1037, which masks the checksum 1035 to generate a masked checksum 1040. The masked checksum 1040 is the checksum that is transmitted as part of the Mark symbol, as discussed further below. The masker 1037 masks the checksum 1035 using a mask pattern assigned to the protocol of the packet. For example, if the protocol of the packet is EHT, then the masker 1037 masks the checksum 1035 using a mask pattern assigned to EHT. In one example, the mask pattern may involve the masker 1037 multiplying each bit in the checksum 1035 by −1 to generate the masked checksum 1040.

After the masked checksum 1040 is generated, the transmitting node includes the masked checksum 1040 in the Mark symbol. Thus, in this example, the masked checksum 1040 is the CRC checksum in field 740 as shown in FIG. 7. The transmitting node transmits the masked checksum 1040 and the information bits 1010 as part of the Mark symbol.

Figure 10B:
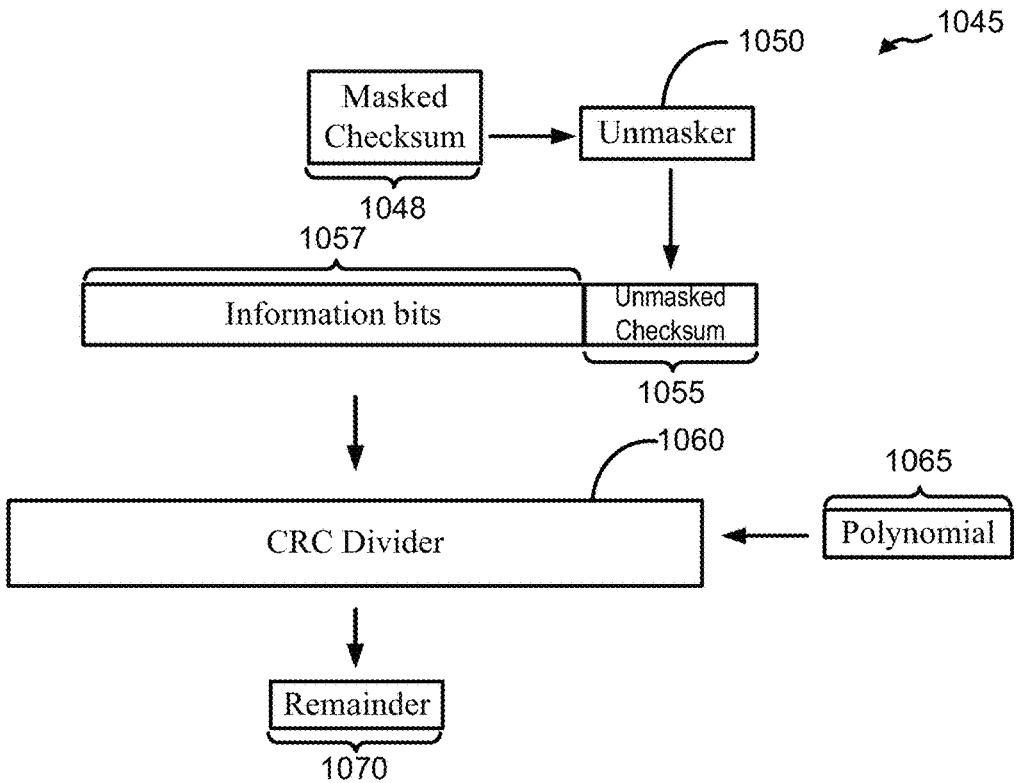
FIG. 10B illustrates another example of a process for determining the protocol of a packet using the checksum in accordance with some aspects of the present disclosure.

Referring to FIG. 10B, the receiving node receives at least a portion of the packet from the transmitting node, and retrieves the information bits 1057 and the masked checksum 1048 from the Mark symbol of the packet. If there are no errors in the received Mark symbol, then the received information bits 1057 are the same as the information bits 1010 at the transmitting node, and the received masked checksum 1048 is the same as the masked checksum 1040 at the transmitting node.

The received masked checksum 1048 is then input to an unmasker 1050, which unmasks the received checksum 1048 to generate an unmasked checksum 1055. The unmasker 1050 may unmask the masked checksum 1048 based on the mask pattern used to mask the checksum 1035 at the transmitting node, and which may be known a priori in the receiving node, so that the unmasker 1050 undoes the masking by the masker 1037. In this case, the unmasked checksum 1055 is the same as the checksum 1035 at the transmitting node if the Mark symbol is received error-free. For example, if the masker 1037 at the transmitting node masks the checksum 1035 by multiplying each bit in the checksum 1035 by −1, then the unmasker 1050 may multiply each bit in the received masked checksum 1048 again by −1 to undo the masking effectuated by the masker 1037 at the transmitting node.

The received information bits 1057 and unmasked checksum 1055 are input to a CRC divider 1060, in which the unmasked checksum 1055 is appended to the received information bits 1057. The CRC divider 1060 divides the received information bits 1057 and the unmasked checksum 1055 by the polynomial 1065, and outputs the remainder 1070 of the division. The polynomial 1065 is the same as the polynomial 1030 used at the transmitting node to generate the checksum 1035. In this regard, the transmitting node and the receiving node may each have a local copy of the polynomial.

The receiving node then checks the remainder 1070 to determine whether the protocol of the packet is the protocol corresponding to the mask pattern. If the remainder 1070 is equal to zero, then the receiving node determines the protocol of the packet is the protocol corresponding to the mask pattern. For example, if the checksum 1035 is masked and unmasked based on the mask pattern assigned to EHT and the received Mark symbol is error-free, then the receiving node determines that the received packet is an EHT packet.

If, on the other hand, the remainder 1070 is non-zero, then the receiving node determines the protocol of the packet is not the protocol corresponding the mask pattern. This may occur if the received Mark symbol has one or more bits in error. This may also occur if the checksum 1035 is masked and unmasked based on different mask patterns.

Figure 11:
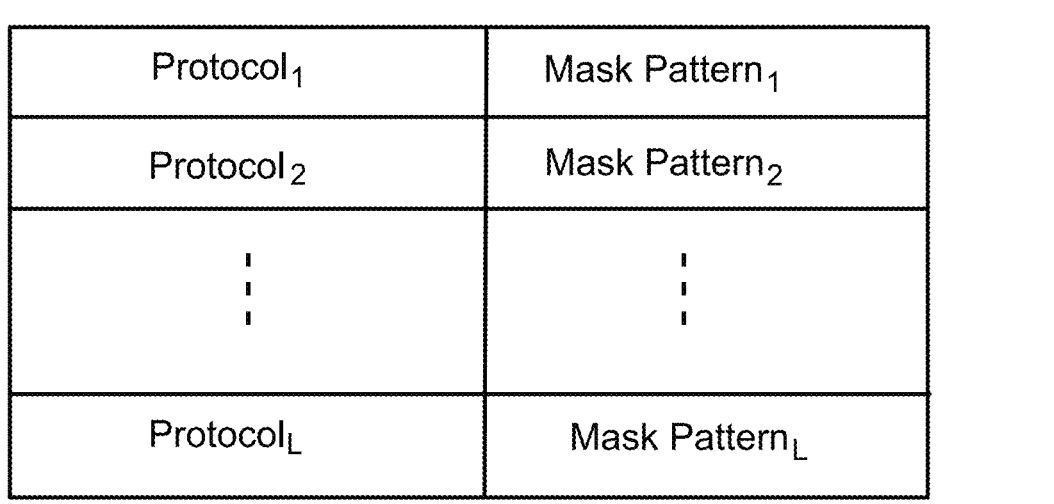
FIG. 11 shows an example of a table mapping different protocols to different mask patterns in accordance with some aspects of the present disclosure.

In some aspects, one of multiple protocols (e.g., EHT and future protocols) may be assigned a respective one of a plurality of mask patterns. In this regard, FIG. 11 shows an exemplary table 1110, in which each one of multiple protocols (labeled Protocol$_1$ to Protocol$_L$) is assigned a respective one of a plurality of mask patterns (labeled Mask Pattern$_1$ to Mask Pattern$_L$). In one example, the first protocol in table 1110 (i.e., Protocol$_1$) might correspond to EHT, and each of the other protocols (i.e., Protocol$_2$ to Protocol$_L$) might correspond to a future protocol. The transmitting node and receiving node may each store a local copy of the table 1110.

In this example, when the transmitting node generates a packet, the transmitting node masks the checksum 1035 using the mask pattern assigned to the protocol of the packet. For example, if the protocol of the packet is Protocol$_1$ in table 1110, then the transmitting node masks the checksum 1035 using Mask Pattern$_1$ to generate the masked checksum 1040. The transmitting node then transmits the masked checksum 1040 and the information bits 1010 as part of the Mark symbol of the packet.

The receiving node receives at least a portion of the packet, and retrieves the information bits 1057 and masked checksum 1048 from the received packet. The receiving node may then perform the process 1045 illustrated in FIG. 10B one or more times to determine the protocol of the packet. Each time the receiving node performs the process 1045, the receiving node unmasks the masked checksum 1048 based on a different one of the mask patterns (Mask Pattern$_1$ to Mask Pattern$_L$). In this example, when a mask pattern results in the remainder 1070 equaling zero, the receiving node determines that the protocol of the packet is the protocol in table 1110 corresponding (i.e., maps) to the mask pattern resulting in the remainder 1070 equaling zero. Thus, the receiving node may determine the protocol of the packet by trying different mask patterns to unmask the received masked checksum 1048 to determine a mask pattern that results in the remainder 1070 equaling zero, and determining the protocol in table 1110 that corresponds (i.e., maps) to the determined mask pattern.

In some aspects, the unmasker 1050 is said to unmask a masked checksum 1048 based on a mask pattern by undoing masking performed by the masker 1037 using the mask pattern. The masker 1037 may perform masking using anyone of a variety of masking techniques known in in the art.

In some aspects, the CRC checksum 740 of FIG. 7 may be manipulated or modified to indicate the protocol of the packet by using a polynomial identifying the protocol (e.g., polynomial assigned to EHT) to generate the checksum 740, as discussed further below with reference to FIGS. 12A and 12B.

Figure 12A:
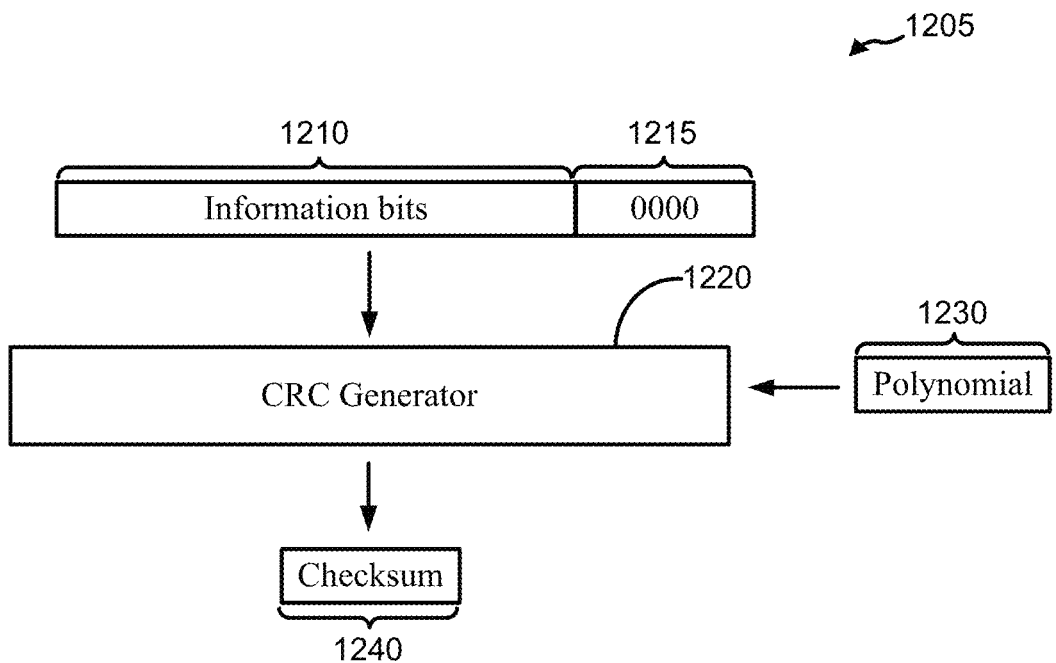
FIG. 12A illustrates yet another example of a process for manipulating a checksum to indicate a protocol in accordance with some aspects of the present disclosure.

Referring to FIG. 12A, at the transmitting node, a process 1205 involves information bits 1210 to be transmitted in the Mark symbol are input to a CRC generator 1220 to generate a CRC checksum 1240. Before the information bits 1210 are input to the CRC generator 1220, a sequence of zero bits 1215 may be appended to the information bits 1210. In one example, the number of zero bits 1215 appended to the information bits 1210 is equal to the number of bits in the checksum 1240, which may be the same as checksum 740 shown in FIG. 7. Further, the information bits 1210 may include the reserved bit 720 and the other information 730 shown in FIG. 7.

The CRC generator 1220 generates the checksum 1240 using polynomial division, in which the CRC generator 1220 divides the information bits 1210 with the appended zero bits 1215 by a polynomial 1230 identifying the protocol of the packet. For example, if the protocol of the packet is EHT, then the polynomial is a polynomial assigned to EHT.

The CRC generator 1220 outputs the remainder of the polynomial division as the checksum 740. Thus, in this example, the checksum 740 is the remainder of the polynomial division.

After the checksum 740 is generated, the transmitting node includes the checksum 740 in the Mark symbol. The transmitting node then transmits the checksum 740 and the information bits 1210 as part of the Mark symbol.

Figure 12B:
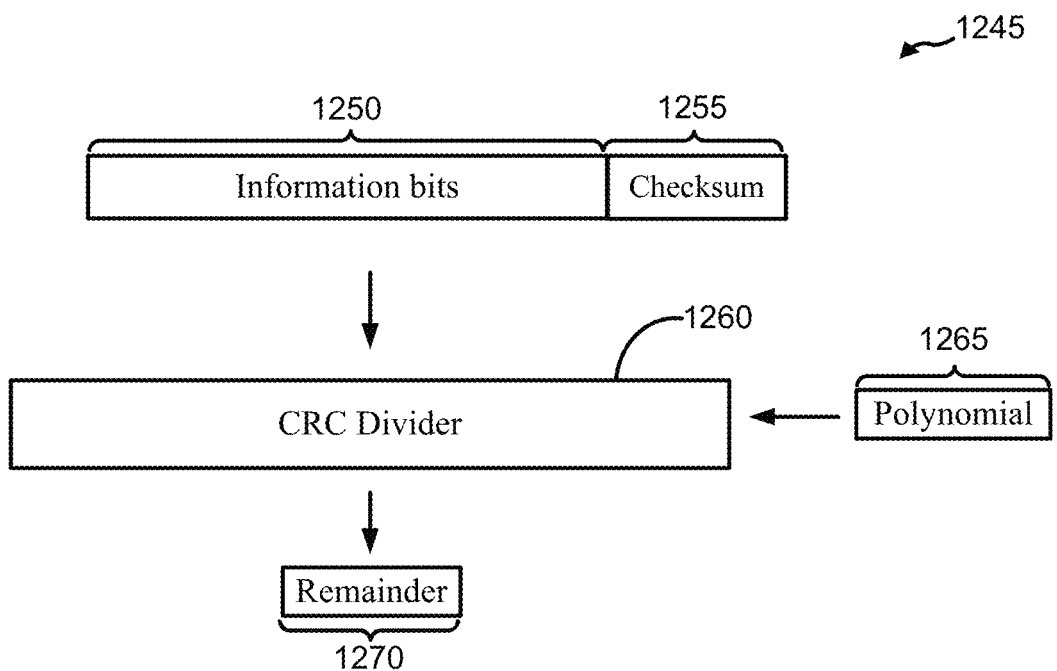
FIG. 12B illustrates yet another example of a process for determining the protocol of a packet using the checksum in accordance with some aspects of the present disclosure.

Referring to FIG. 12B, the receiving node receives at least a portion of the packet from the transmitting node, and retrieves the information bits 1250 and the checksum 1255 from the Mark symbol of the packet. If there are no errors in the received Mark symbol, then the received information bits 1250 are the same as the information bits 1210 at the transmitting node, and the received checksum 1255 is the same as the checksum 740 at the transmitting node.

The received information bits 1250 and checksum 1255 are input to a CRC divider 1260, in which the checksum 1255 is appended to the received information bits 1250. The CRC divider 1260 divides the received information bits 1250 and checksum 1255 by a polynomial 1265 identifying a protocol (e.g., EHT). If polynomials 1265 and 1230 identify the same protocol (e.g., EHT) then the polynomials 1265 and 1230 are the same. The CRC divider 1260 outputs the remainder 1270 of the division.

The receiving node then checks the remainder 1270 to determine whether the protocol of the packet is the protocol identified by the polynomial 1265. If the remainder 1270 is equal to zero, then the receiving node determines the protocol of the packet is the protocol corresponding to polynomial 1265. For example, if the polynomial 1265 identifies EHT (i.e., the polynomial 1265 is the polynomial assigned to EHT) and the remainder is zero, then the receiving node determines that the received packet is an EHT packet.

If, on the other hand, the remainder 1270 is non-zero, then the receiving node determines the protocol of the packet is not the protocol corresponding to polynomial 1265. This may occur if the received Mark symbol has one or more bits in error. This may also occur if different polynomials corresponding to different protocols are used at the transmitting node and the receiving node.

In some aspects, each one of multiple protocols (e.g., EHT and future protocols) may be assigned a respective one of a plurality of polynomials. In this regard, FIG. 13 shows an exemplary table 1310, in which each one of multiple protocols (labeled $Protocol_1$ to $Protocol_L$) is assigned a respective one of a plurality of polynomials (labeled $Polynomial_1$ to $Polynomial_L$). In one example, the first protocol in table 1310 (i.e., $Protocol_1$) corresponds to EHT, and each of the other protocols (i.e., $Protocol_2$ to $Protocol_L$) corresponds to a future protocol. The transmitting node and receiving node may each store a local copy of the table 1310.

In this example, when the transmitting node generates a packet, the transmitting node generates the checksum 1240 using the polynomial assigned to the protocol of the packet. For example, if the protocol of the packet is $Protocol_1$ in table 1310, then the transmitting node generates the checksum 1240 by dividing the information bits 1210 with the appended zero bits 1215 by $Polynomial_1$. The transmitting node then transmits the checksum 1240 and the information bits 1210 as part of the Mark symbol of the packet.

The receiving node receives at least a portion of the packet, and retrieves the information bits 1250 and checksum 1255 from the received packet. The receiving node may then perform the process 1245 illustrated in FIG. 12B one or more times to determine the protocol of the packet. Each time the receiving node the performs the process 1245, the receiving node uses a different polynomial to compute the remainder 1270. In this example, when a polynomial results in the remainder 1270 equaling zero, the receiving node determines that the protocol of the packet is the protocol in table 1310 corresponding to the polynomial resulting in the remainder 1270 equaling zero. Thus, the receiving node may determine the protocol of the packet by trying different polynomials to compute the remainder 1270 to determine a polynomial that results in the remainder 1270 equaling zero, and determining the protocol in table 1310 that corresponds (i.e., maps) to the determined polynomial.

The other information 430 or 730 discussed above may include different types of information. For example, the other information 430 or 730 may include a basic service set (BSS) color (e.g., six bits), which may be a numerical identifier of a BSS of the packet. In an example, the receiving node may use the BSS color to identify the AP that transmitted the packet.

In another example, the other information 430 or 730 may include a bandwidth indicator indicating a bandwidth of the packet (e.g., channel width of the packet). In this example, the receiving node may set the receive bandwidth of its receiver based on the indicated bandwidth of the packet to receive the rest of the packet.

In another example, the other information 430 or 730 may include a spatial reuse indicator indicating whether spatial reuse is permitted over the packet. In yet another example, the other information 430 or 730 may include an indicator indicating a duration until the end of a transmit opportunity (TXOP), which may span multiple packets. In still another example, the other information 430 or 730 may include an indicator indicating a format of the packet (e.g., single user (SU), multi-user (MU), etc.). Thus, in summary, the other information 430 or 730 may include at least one of one or more first bits indicating a basic service set (BSS) color, one or more second bits indicating a bandwidth of the packet, one or more third bits indicating whether spatial reuse is permitted, one or more fourth bits indicating a duration of a transmission, or one or more fifth bits indicating a format of the packet.

As discussed above, when the transmitting node generates a packet for transmission, the transmitting node indicates the protocol of the packet in the Mark symbol (e.g., by inserting the value assigned to the protocol in the signature field or manipulating the checksum). Before generating the packet, the transmitting node may select the protocol for the packet. For example, the transmitting node may select the protocol based on the capabilities of the receiving node. In this example, the transmitting node may select the protocol with the highest throughput that is supported by the receiving node. The transmitting node may select the protocol from the multiple protocols (i.e., $Protocol_1$ to $Protocol_L$) according to the signature values, mask patterns, or polynomials as was shown in tables 910, 1110 or 1310, respectively. In this example, the transmitting node uses the signature value, mask pattern or polynomial assigned to the selected polynomial to generate the checksums 740 or 1040, or the masked checksum 1040.

As discussed above, the receiving node may determine the protocol of the packet based on a signature value or checksum in the packet. After determining the protocol, the receiving node may process the rest of the preamble of the packet based on the determined protocol. As discussed above, each protocol has a predefined preamble structure (i.e., format). Thus, by determining the protocol of the packet, the receiving node is able to detect the preamble of the packet. This allows the receiving node to properly process the preamble and recover the data in the packet (e.g., data in the payload of the packet). For example, knowledge of the protocol (and hence preamble structure) allows the receiving node to properly interpret the information in the fields (e.g., signal fields) of the preamble of the packet, and use this information (e.g., channel bandwidth, packet length, modulation scheme, etc.) to recover (e.g., demodulate, decode, etc.) the data in the packet.

Figure 14:
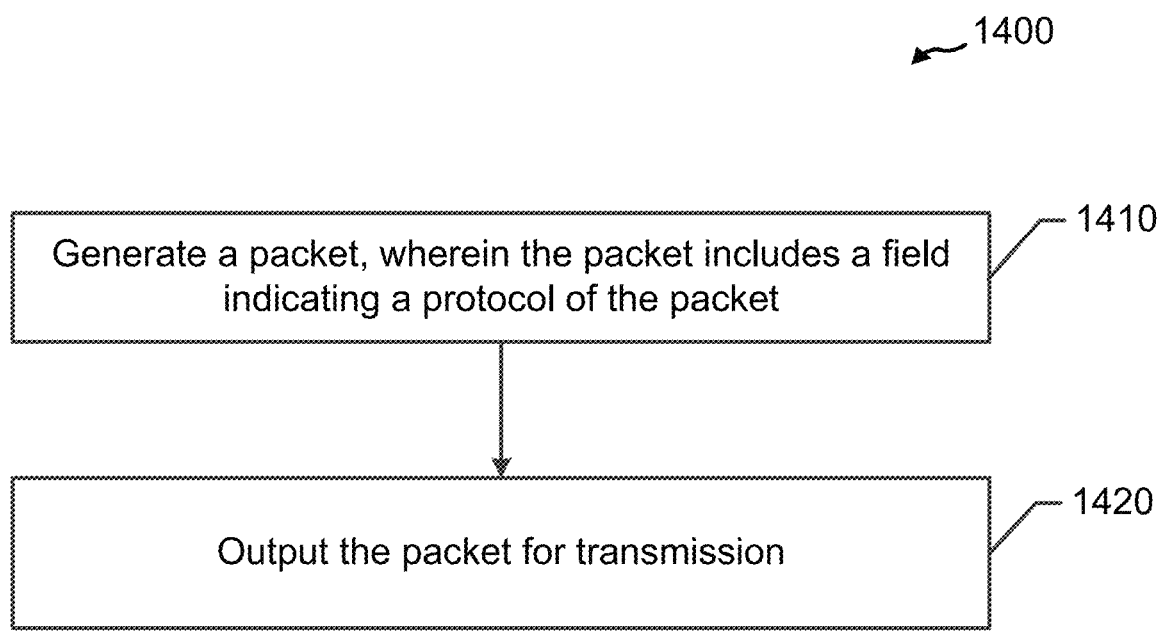
FIG. 14 shows a flowchart illustrating a method for wireless communications in accordance with some aspects of the present disclosure.

FIG. 14 illustrates a method 1400 for wireless communication according to some aspects. The method 1400 may be performed by an AP (e.g., AP 202) or an AT (e.g., STA 204).

At block 1410, a packet is generated, wherein the packet includes a field indicating a protocol of the packet. For example, the field (e.g., Mark symbol) may include a signature (e.g., signature 410) identifying the protocol. In this example, the signature may comprise a value assigned to the protocol. In another example, the field may include a checksum (e.g., checksum 740) that has been manipulated to indicate the protocol. In this example, the checksum may be generated using a signature, mask pattern or polynomial identifying the protocol, as discussed above. At block 1420, the packet is output for transmission.

Figure 15:
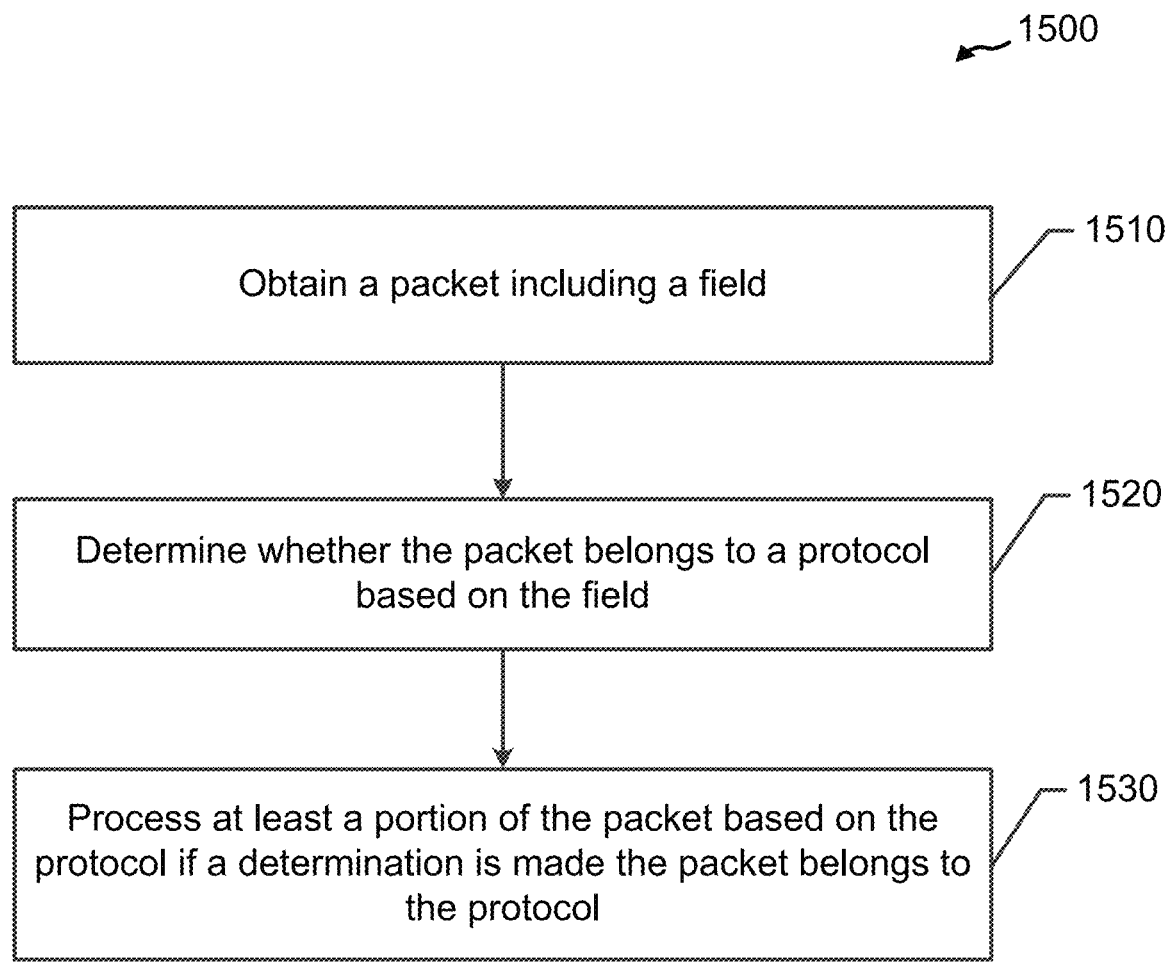
FIG. 15 shows a flowchart illustrating another method for wireless communications in accordance with some aspects of the present disclosure.

FIG. 15 illustrates a method 1500 for wireless communication according to some aspects. The method 1500 may be performed by an AP (e.g., AP 202) or an AT (e.g., STA 204). At block 1510, a packet including a field is obtained. For example, the field (e.g., Mark symbol) may include a checksum (e.g., checksum 740) that has been manipulated to indicate a protocol or a signature (e.g., signature 410) identifying a protocol.

At block 1520, a determination is made whether the packet belongs to a protocol based on the field. For example, a determination may be made that the packet belongs to the protocol if the signature identifies the protocol (e.g., the signature has a value assigned to the protocol (e.g., EHT)). In another example, the checksum and information bits in the packet (e.g., information bits 1250) may be divided by a polynomial identifying the protocol to generate a remainder. In this example, a determination may be made that the packet belongs to the protocol if the remainder equals zero. In another example, the checksum may be unmasked by a mask pattern identifying the protocol to generate an unmasked checksum. The unmasked checksum and information bits in the packet (e.g., information bits 1057) may be divided by a polynomial to generate a remainder. In this example, a determination may be made that the packet belongs to the protocol if the remainder equals zero. In yet another example, information bits in the packet (e.g., information bits 850) are concatenated with a signature (e.g., sequence of bits) identifying the protocol to generate a combined sequence of bits. The checksum and the combined sequence of bits may be divided by a polynomial to generate a remainder. In this example, a determination may be made that the packet belongs to the protocol if the remainder equals zero.

At block 1530, at least a portion of the packet is processed based on the protocol if a determination is made the packet belongs to the protocol. The portion of the packet may include the rest of the packet (e.g., rest of the preamble, the data payload of the packet, etc.). The rest of the preamble may include a signal field (e.g., EHT SIGA) predefined for the protocol (e.g., EHT).

Figure 16:
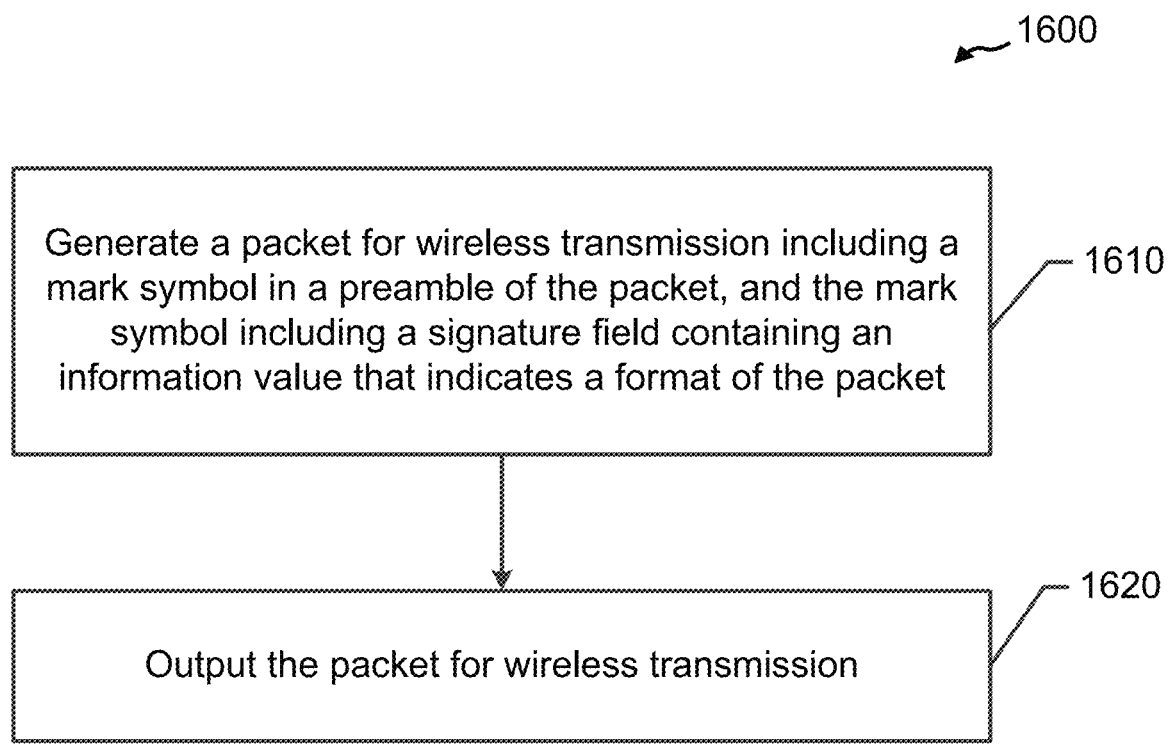
FIG. 16 shows a flowchart illustrating another method for wireless communications in accordance with some aspects of the present disclosure.

FIG. 16 illustrates another method 1600 for wireless communication by a wireless communication device according to some aspects. The method 1600 may be performed by an AP (e.g., AP 202) or an AT (e.g., STA 204), as well as by apparatus 1800 in FIG. 18, which will be discussed later. Method 1600 includes generating a packet for wireless transmission as shown in block 1610. The packet includes a mark symbol in a preamble of the packet such as 302 shown in FIG. 3. Additionally, the mark symbol includes a signature field containing an information value that indicates a protocol of the packet, such as the field shown at 410 in FIG. 4, as one example. Method 1600 further includes outputting the packet for wireless transmission as shown in block 1620, where the transmission be accomplished by one or more of a modem and radio devices or other components in a wireless communication device.

In further aspects, method 1600 includes assigning each one of multiple protocols a respective information value from a plurality of information values, selecting the protocol from the multiple protocols; and setting the selected information value assigned to the protocol as the information value in the signature field.

In still other aspects, method 1600 may include the mark symbol further having at least one of a first indicator indicating a basic service set (BSS) color, a second indicator indicating a bandwidth of the packet, a third indicator indicating whether spatial reuse is permitted, a fourth indicator indicating a duration of a transmission, or a fifth indicator indicating a physical layer conformance procedure (PLCP) protocol data unit (PPDU) protocol of the packet. Additionally, method 1600 may include further setting a bit in a B2 bit position of the mark symbol to a logic value of one, which helps to reduce HE false detections as EHT in some systems.

In yet other aspects, method 1600 may include modulating the mark symbol using binary phase-shift keying (BPSK) modulation at a one-half coding rate for a 20 MHz PPDU or channel, as one example, but is not limited to such modulation. Also, method 1600 may include placing or locating the mark symbol within the preamble of the packet immediately following a legacy signal (L-SIG) field, such as was illustrated in FIG. 3 showing the mark or marker symbol 302 occurring in time after the L-SIG field in the legacy preamble portion, and immediately so in the illustrated example.

Figure 17:
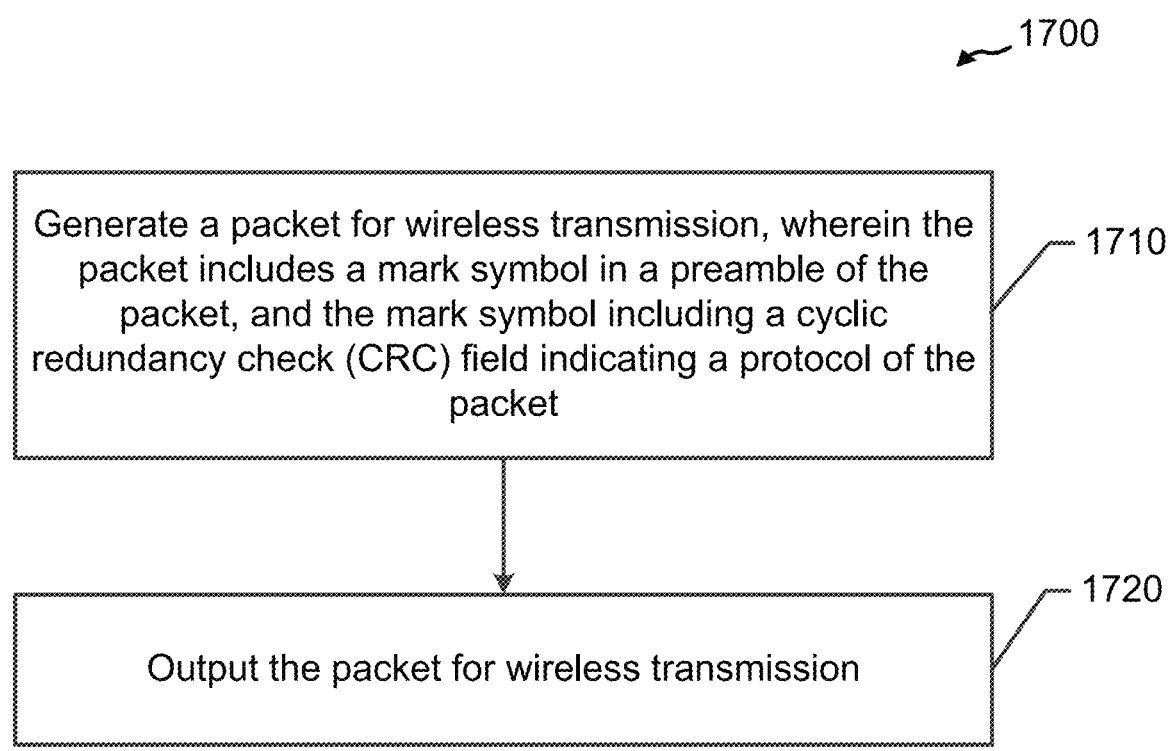
FIG. 17 shows a flowchart illustrating another method for wireless communications in accordance with some aspects of the present disclosure.

FIG. 17 illustrates another method 1700 for wireless communication by a wireless communication device. Method 1700 may be performed by an AP (e.g., AP 202) or an AT (e.g., STA 204), as well as by apparatus 1800 in FIG. 18, which will be discussed later. As shown in FIG. 17, method 1700 includes generating a packet for wireless transmission, wherein the packet includes a mark symbol in a preamble of the packet, and the mark symbol includes a cyclic redundancy check (CRC) field that is used to indicate a protocol of the packet as indicated at block 1710. It is noted that the processes of block 1710 may encompass the various processes illustrated in FIG. 6A, 7, 8A, 10A, or 12A as examples, but not limited to such.

Method 1700 further includes outputting the packet to a transmission interface for wireless transmission as shown in block 1720, where the transmission interface may include one or more of a modem and radio devices or components in a wireless communication device.

In further aspects, method 1700 may include concatenating a first sequence of bits and a second sequence of bits to generate a combined sequence of bits, wherein the first sequence of bits corresponds to a value identifying the protocol of the packet. Additionally method 1700 may include performing a cyclic redundancy check on the combined sequence of bits to generate a checksum, wherein the mark symbol includes the second sequence of bits and the generated checksum is included in the CRC field. Of further note, method 1700 may include assigning each one of multiple protocols a respective sequence of bits from a plurality of sequences of bits, selecting the protocol from the multiple protocols, and using the sequence of bits assigned to the protocol as the first sequence of bits.

In still other aspects, method 1700 may include performing a cyclic redundancy check on a sequence of bits to generate a checksum, and masking the checksum using a mask pattern to generate a masked checksum, wherein the mask pattern identifies the protocol, and the mark symbol includes the sequence of bits and the masked checksum is included in the CRC field. Further, method 1700 may include assigning each one of multiple protocols a respective mask pattern from a plurality of mask patterns, selecting the protocol from the multiple protocols, and using the mask pattern assigned to the protocol as the mask pattern.

In still other aspects, method 1700 may include setting a predefined CRC polynomial string that is configured to identify the protocol and is known to both the apparatus and a receiver of a wireless transmission from the wireless communication apparatus. Additionally, a cyclic redundancy check may then be performed on a sequence of bits comprising the mark symbol to generate a checksum and include the generated checksum in the CRC field. According to further aspects, the predetermined CRC polynomial string may be used by receiver of the packet to determine the protocol through a division process, as was discussed before.

Figure 18:
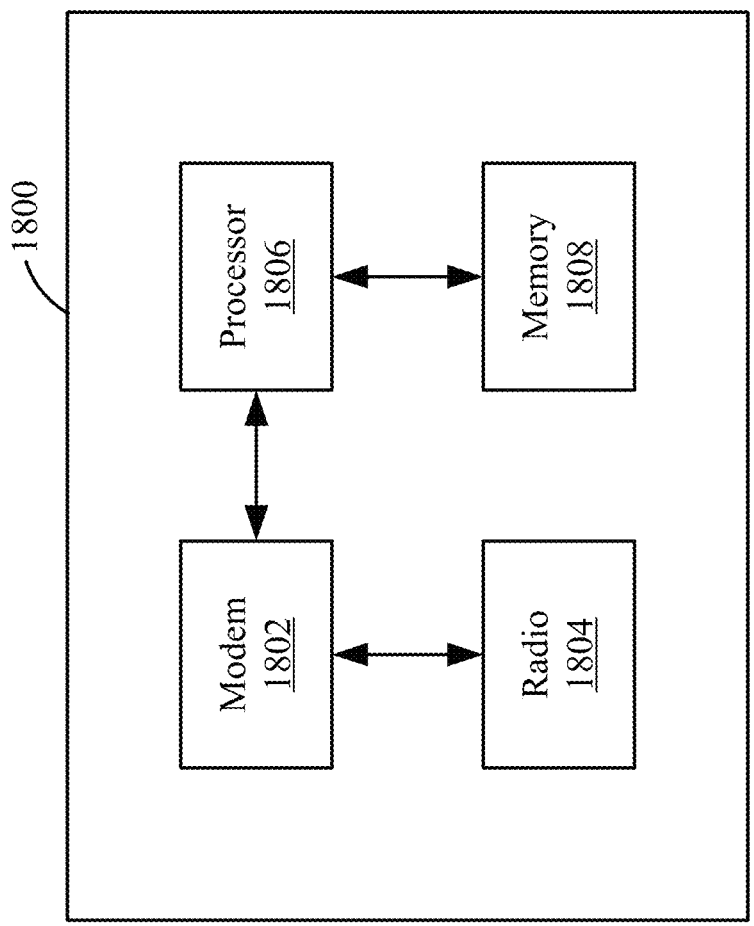
FIG. 18 illustrates an example device in accordance with some aspects of the present disclosure.

FIG. 18 shows a block diagram of an example wireless communication device 1800. In some implementations, the wireless communication device 1800 can be an example of a device for use in a STA such as one of the STAs 104 described above with reference to FIG. 1. In some implementations, the wireless communication device 1800 can be an example of a device for use in an AP such as the AP 102 described above with reference to FIG. 1. The wireless communication device 1800 is capable of transmitting (or outputting for transmission) and receiving wireless communications (for example, in the form of wireless packets). For example, the wireless communication device can be configured to transmit and receive packets in the form of physical layer convergence protocol (PLCP) protocol data units (PPDUs) and medium access control (MAC) protocol data units (MPDUs) conforming to an IEEE 802.11 wireless communication protocol standard, such as that defined by the IEEE 802.11-2016 specification or amendments thereof including, but not limited to, 802.11ah, 802.11ad, 802.11ay, 802.11ax, 802.11az, 802.11ba and 802.11be.

The wireless communication device 1800 can be, or can include, a chip, system on chip (SoC), chipset, package or device that includes one or more modems 1802, for example, a Wi-Fi (IEEE 802.11 compliant) modem. In some implementations, the one or more modems 1802 (collectively "the modem 1802") additionally include a WWAN modem (for example, a 3GPP 4G LTE or 5G compliant modem). In some implementations, the wireless communication device 1800 also includes one or more radios 1804 (collectively "the radio 1804"). In some implementations, the wireless communication device 1806 further includes one or more processors, processing blocks or processing elements 1806 (collectively "the processor 1806") and one or more memory blocks or elements 1808 (collectively "the memory 1808").

The modem 1802 can include an intelligent hardware block or device such as, for example, an application-specific integrated circuit (ASIC) among other possibilities. The modem 1802 is generally configured to implement a PHY layer. For example, the modem 1802 is configured to modulate packets and to output the modulated packets to the radio 1804 for transmission over the wireless medium. The modem 1802 is similarly configured to obtain modulated packets received by the radio 1804 and to demodulate the packets to provide demodulated packets. In addition to a modulator and a demodulator, the modem 1802 may further include digital signal processing (DSP) circuitry, automatic gain control (AGC), a coder, a decoder, a multiplexer and a demultiplexer. For example, while in a transmission mode, data obtained from the processor 1806 is provided to a coder, which encodes the data to provide encoded bits. The encoded bits are then mapped to points in a modulation constellation (using a selected MCS) to provide modulated symbols. The modulated symbols may then be mapped to a number NSS of spatial streams or a number NSTS of space-time streams. The modulated symbols in the respective spatial or space-time streams may then be multiplexed, transformed via an inverse fast Fourier transform (IFFT) block, and subsequently provided to the DSP circuitry for Tx windowing and filtering. The digital signals may then be provided to a digital-to-analog converter (DAC). The resultant analog signals may then be provided to a frequency upconverter, and ultimately, the radio 1804. In implementations involving beamforming, the modulated symbols in the respective spatial streams are precoded via a steering matrix prior to their provision to the IFFT block.

While in a reception mode, digital signals received from the radio 1804 are provided to the DSP circuitry, which is configured to acquire a received signal, for example, by detecting the presence of the signal and estimating the initial timing and frequency offsets. The DSP circuitry is further configured to digitally condition the digital signals, for example, using channel (narrowband) filtering, analog impairment conditioning (such as correcting for I/Q imbalance), and applying digital gain to ultimately obtain a narrowband signal. The output of the DSP circuitry may then be fed to the AGC, which is configured to use information extracted from the digital signals, for example, in one or more received training fields, to determine an appropriate gain. The output of the DSP circuitry also is coupled with the demodulator, which is configured to extract modulated symbols from the signal and, for example, compute the logarithm likelihood ratios (LLRs) for each bit position of each subcarrier in each spatial stream. The demodulator is coupled with the decoder, which may be configured to process the LLRs to provide decoded bits. The decoded bits from all of the spatial streams are then fed to the demultiplexer for demultiplexing. The demultiplexed bits may then be descrambled and provided to the MAC layer (the processor 1806) for processing, evaluation or interpretation.

The radio 1804 generally includes at least one radio frequency (RF) transmitter (or "transmitter chain") and at least one RF receiver (or "receiver chain"), which may be combined into one or more transceivers. For example, the RF transmitters and receivers may include various DSP circuitry including at least one power amplifier (PA) and at least one low-noise amplifier (LNA), respectively. The RF transmitters and receivers may, in turn, be coupled to one or more antennas. For example, in some implementations, the wireless communication device 1800 can include, or be coupled with, multiple transmit antennas (each with a corresponding transmit chain) and multiple receive antennas (each with a corresponding receive chain). The symbols output from the modem 1802 are provided to the radio 1804, which then transmits the symbols via the coupled antennas.

Similarly, symbols received via the antennas are obtained by the radio 1804, which then provides the symbols to the modem 1802.

The processor 1806 can include an intelligent hardware block or device such as, for example, a processing core, a processing block, a central processing unit (CPU), a microprocessor, a microcontroller, a digital signal processor (DSP), an application-specific integrated circuit (ASIC), a programmable logic device (PLD) such as a field programmable gate array (FPGA), discrete gate or transistor logic, discrete hardware components, or any combination thereof designed to perform the functions described herein. The processor 1806 processes information received through the radio 1804 and the modem 1802, and processes information to be output through the modem 1802 and the radio 1804 for transmission through the wireless medium. For example, the processor 1806 may implement a control plane and MAC layer configured to perform various operations related to the generation and transmission of MPDUs, frames or packets. The MAC layer is configured to perform or facilitate the coding and decoding of frames, spatial multiplexing, space-time block coding (STBC), beamforming, and OFDMA resource allocation, among other operations or techniques. In some implementations, the processor 1806 may generally control the modem 1802 to cause the modem to perform various operations described above.

The memory 1804 can include tangible storage media such as random-access memory (RAM) or read-only memory (ROM), or combinations thereof. The memory 1804 also can store non-transitory processor- or computer-executable software (SW) code containing instructions that, when executed by the processor 1806, cause the processor to perform various operations described herein for wireless communication, including the generation, transmission, reception and interpretation of MPDUs, frames or packets. For example, various functions of components disclosed herein, or various blocks or steps of a method, operation, process or algorithm disclosed herein, can be implemented as one or more modules of one or more computer programs.

In some aspects, the processor 1806 may include one or more of the following: a CRC generator (e.g., CRC generator 620, 820, 1020 or 1220), a CRC divider (e.g., CRC divider 660, 860, 1060 or 1260), a masker (e.g., masker 1037) and/or an unmasker (e.g., unmasker 1050) for performing one or more of the operations described herein.

Examples of means for generating a packet, wherein the packet includes a field indicating a protocol of the packet may include at least one of the application processor 230 or the processor 1806. Examples of means for outputting the packet for transmission may include at least one of the WCD 210, antennas 220, the modem 1802, or radio 1804. Examples of means for selecting the protocol from the multiple protocols may include at least one of processor 230 or processor 1806. Examples of means for using the value assigned to the protocol for the signature in the mark symbol may include at least one of the at least one of processor 230 or processor 1806. Examples of means for setting a bit in a B2 bit position of the field to a logic value of one may include at least one at least one of processor 230 or processor 1806. Examples of means for concatenating a first sequence of bits and a second sequence of bits to generate a combined sequence of bits, wherein the first sequence of bits identifies the protocol may include at least one of the at least one of processor 230 or processor 1806. Examples of means for performing cyclic redundancy check (CRC) on the combined sequence of bits to generate a checksum, wherein the field includes the second sequence of bits and the checksum may include at least one of at least one of processor 230 or processor 1806. Examples of means for selecting the protocol from the multiple protocols may include at least one of at least one of processor 230 or processor 1806. Examples of means for using the sequence of bits assigned to the protocol as the first sequence of bits may include at least one of at least one of processor 230 or processor 1806. Examples of means for performing a cyclic redundancy check (CRC) on a sequence of bits to generate a checksum may include at least one of the at least one of processor 230, the CRC generator 1020, or the processing system 1806. Examples of means for masking the checksum using a mask pattern to generate a masked checksum, wherein the mask pattern identifies the protocol, and the field includes the sequence of bits and the masked checksum may include at least one of the processor 230, the masker 1037, or the processor 1806. Examples of means for selecting the protocol from the multiple protocols may include at least one of the processor 230 or the processor 1806. Examples of means for using the mask pattern assigned to the protocol as the mask pattern may include at least one of the processor 230, the masker 1037, or the processor 1806. Examples of means for masking the checksum with the mask pattern may include at least one of the processor 230, the masker 1037, or the processor 1806. Examples of means for performing a cyclic redundancy check (CRC) on a sequence of bits using a polynomial to generate a checksum, wherein the polynomial identifies the protocol, and the field includes the sequence of bits and the checksum may include at least one of the processor 230, the CRC generator 1220, or the processor 1806. Examples of means for selecting the protocol from the multiple protocols may include at least one of the processor 230 or the processor 1806. Examples of means for using the polynomial assigned to the protocol as the polynomial may include at least one of the processor 230 or the processor 1806. Examples of means for dividing the sequence of bits by the polynomial to generate the checksum may include at least one of the processor 230 or the processor 1806, or the CRC generator 1220. Examples of means for appending one or more zero bits to the sequence of bits before dividing the sequence of bits by the polynomial may include at least one of the processor 230, the CRC generator 1220, or the processor 1806.

Examples of means for obtaining a packet including a mark symbol may include at least one of the application processor 235, WCD 215, and antenna 225. Examples of means for determining whether the packet belongs to a protocol based on the mark symbol may include at least one of the processor 235, WCD 215, or the processor 1806. Examples of means for processing at least a portion of the packet based on the protocol if a determination is made the packet belongs to the protocol may include at least one of the processor 235, WCD 215, or the processor 1806. Means for determining whether the packet belongs to the protocol based on the signature may include at least one of the processor 235, WCD 215, or the processor 1806. Examples of means for determining the protocol belongs to the protocol if the protocol is assigned to the one of the plurality of values may include at least one of the processor 235, WCD 215, or the processor 1806. Examples of means for concatenating a second sequence of bits and the first sequence to generate a combined sequence of bits may include at least one of the processor 235, WCD 215, or the processor 1806. Examples of means for dividing the combined sequence of bits and the checksum by a polynomial to generate a remainder may include at least one of the processor 235, WCD 215, the processor 1806, or the CRC divider 860.

Examples of means for determining whether the packet belongs to the protocol based on the remainder may include at least one of the processor 235, WCD 215, or the processor 1806. Examples of means for determining the packet belongs to the protocol if the remainder is zero may include at least one of the processor 235, WCD 215, or the processor 1806. Examples of means for determining the packet does not belong to the protocol if the remainder is non-zero may include at least one of the processor 235, WCD 215, or the processor 1806. Examples of means for determining the packet belongs to the protocol if the protocol is assigned to the second sequence of bits may include at least one of the processor 235, WCD 215, or the processor 1806. Examples of means for unmasking the masked checksum using a mask pattern to generate an unmasked checksum may include at least one of the processor 235, WCD 215, the processor 1806, or the unmasker 1050. Examples of means for dividing the sequence of bits and the unmasked checksum by a polynomial to generate a remainder may include at least one of the processor 235, WCD 215, the processor 1806, or the CRC divider 1060. Examples of means for determining whether the packet belongs to the protocol based on the remainder may include at least one of the controller processor 235, WCD 215, or the processor 1806. Examples of means for determining the packet belongs to the protocol if the remainder is zero may include at least one of the processor 235, WCD 215, or the processor 1806. Examples of means for determining the packet does not belong to the protocol if the remainder is non-zero may include at least one of the processor 235, WCD 215, or the processor 1806. Example of means for determining the packet belongs to the protocol if the protocol is assigned to the mask pattern may include at least one of the processor 235, WCD 215, or the processor 1806. Examples of means for unmasking the masked checksum with the mask pattern may include at least one of the processor 235, WCD 215, or the processor 1806. Examples of means for dividing the sequence of bits and the checksum by a polynomial to generate a remainder may include at least one of the processor 235, WCD 215, the processor 1806, or the CRC divider 1260. Examples of means for determining whether the packet belongs to the protocol based on the remainder may include at least one of the processor 235, WCD 215, or the processor 1806. Examples of means for determining the packet belongs to the protocol if the remainder is zero may include at least one of the processor 235, WCD 215, or the processor 1806. Examples of means for determining the packet does not belong to the protocol if the remainder is non-zero may include at least one of the processor 235, WCD 215, or the processor 1806. Examples of means for determining the packet belongs to the protocol if the protocol is assigned to the polynomial may include at least one of the processor 235, WCD 215, or the processor 1806.

As used herein, "or" is used intended to be interpreted in the inclusive sense, unless otherwise explicitly indicated. For example, "a or b" may include a only, b only, or a combination of a and b. As used herein, a phrase referring to "at least one of" or "one or more of" a list of items refers to any combination of those items, including single members. For example, "at least one of: a, b, or c" is intended to cover the possibilities of: a only, b only, c only, a combination of a and b, a combination of a and c, a combination of b and c, and a combination of a and b and c.

The various illustrative components, logic, logical blocks, modules, circuits, operations and algorithm processes described in connection with the implementations disclosed herein may be implemented as electronic hardware, firmware, software, or combinations of hardware, firmware or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the particular application and design constraints imposed on the overall system.

Various modifications to the implementations described in this disclosure may be readily apparent to persons having ordinary skill in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, various features that are described in this specification in the context of separate implementations also can be implemented in combination in a single implementation. Conversely, various features that are described in the context of a single implementation also can be implemented in multiple implementations separately or in any suitable subcombination. As such, although features may be described above as acting in particular combinations, and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one or more example processes in the form of a flowchart or flow diagram. However, other operations that are not depicted can be incorporated in the example processes that are schematically illustrated. For example, one or more additional operations can be performed before, after, simultaneously, or between any of the illustrated operations. In some circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

What is claimed is:

1. A wireless communication device comprising:
   at least one modem;
   at least one processor communicatively coupled with the at least one modem; and
   at least one memory communicatively coupled with the at least one processor and storing processor-readable code that, when executed by the at least one processor in conjunction with the at least one modem, is configured to:
   generate a packet for wireless transmission, wherein the packet includes a field in a preamble of the packet, the field including:
   a first indicator including a first value indicating a wireless communication protocol used for generating the packet;

a second indicator indicating a basic service set (BSS) color;
a third indicator indicating a bandwidth of the packet; and
a fourth indicator indicating a duration of a transmit opportunity (TXOP) during which at least the packet is transmitted; and
output the packet for wireless transmission.

2. The wireless communication device of claim 1, wherein:
each of a plurality of wireless communication protocols, including the wireless communication protocol, is associated with a respective value from a plurality of information values, including the first value.

3. The wireless communication device of claim 1, wherein the field further includes a fifth indicator indicating whether spatial reuse is permitted or a sixth indicator indicating a physical layer conformance procedure (PLCP) protocol data unit (PPDU) format of the packet.

4. The wireless communication device of claim 1, wherein the field is modulated using binary phase-shift keying (BPSK) modulation at a one-half coding rate for a 20 MHz channel.

5. The wireless communication device of claim 1, wherein the field immediately follows a legacy signal (L-SIG) field within the preamble of the packet.

6. A method for wireless communication by a wireless communication device comprising:
generating a packet for wireless transmission, wherein the packet includes a field in a preamble of the packet, the field including:
a first indicator including a first value indicating a wireless communication protocol used for generating the packet;
a second indicator indicating a basic service set (BSS) color;
a third indicator indicating a bandwidth of the packet; and
a fourth indicator indicating a duration of a transmit opportunity (TXOP)
during which at least the packet is transmitted; and
outputting the packet to a transmission interface for wireless transmission.

7. The method of claim 6, wherein:
each of a plurality of wireless communication protocols, including the wireless communication protocol, is associated with a respective value from a plurality of information values, including the first value.

8. The method of claim 6, wherein the field further includes a fifth indicator indicating whether spatial reuse is permitted or a sixth indicator indicating a physical layer conformance procedure (PLCP) protocol data unit (PPDU) protocol of the packet.

9. The method of claim 6, further comprising modulating the field using binary phase-shift keying (BPSK) modulation at a one-half coding rate for a 20 MHz channel.

10. The method of claim 6, wherein the field immediately follows a legacy signal (L-SIG) field within the preamble of the packet.

11. A wireless communication device comprising:
at least one modem;
at least one processor communicatively coupled with the at least one modem; and
at least one memory communicatively coupled with the at least one processor and storing processor-readable code that, when executed by the at least one processor in conjunction with the at least one modem, is configured to:
generate a packet for wireless transmission, wherein the packet includes a mark symbol in a preamble of the packet, the mark symbol including a cyclic redundancy check (CRC) field indicating a wireless communication protocol used in generating the packet; and
output the packet for wireless transmission.

12. The wireless communication device of claim 11, wherein the at least one memory communicatively coupled with the at least one processor and storing processor-readable code that, when executed by the at least one processor in conjunction with the at least one modem, is further configured to:
concatenate a first sequence of bits and a second sequence of bits to generate a combined sequence of bits, wherein the first sequence of bits corresponds to a value identifying the wireless communication protocol used in generating of the packet; and
perform a cyclic redundancy check on the combined sequence of bits to generate a checksum, wherein the mark symbol includes the second sequence of bits and wherein the CRC field includes the checksum.

13. The wireless communication device of claim 12, wherein:
each of a plurality of wireless communication protocols, including the wireless communication protocol, is associated with a respective sequence of bits from a plurality of sequences of bits.

14. The wireless communication device of claim 11, wherein the at least one memory communicatively coupled with the at least one processor and storing processor-readable code that, when executed by the at least one processor in conjunction with the at least one modem, is further configured to:
perform a CRC on a sequence of bits to generate a checksum; and
mask the checksum using a mask pattern to generate a masked checksum, wherein the mask pattern identifies the protocol, and wherein the mark symbol includes the sequence of bits and the CRC field includes the masked checksum.

15. The wireless communication device of claim 14, wherein:
each of a plurality of multiple protocols is assigned a respective mask pattern from a plurality of mask patterns.

16. The wireless communication device of claim 11, wherein the at least one memory communicatively coupled with the at least one processor and storing processor-readable code that, when executed by the at least one processor in conjunction with the at least one modem, is further configured to:
set a predefined CRC polynomial string that is configured to identify the wireless communication protocol and that is known to both the wireless communication device and a receiver of a wireless transmission from the wireless communication device; and
perform a cyclic redundancy check on a sequence of bits in the mark symbol to generate a checksum, wherein the CRC field includes the checksum.

17. The wireless communication device of claim 11, wherein the mark symbol further includes at least one of a first indicator indicating a basic service set (BSS) color, a second indicator indicating a bandwidth of the packet, a third indicator indicating whether spatial reuse is permitted, a fourth indicator indicating a duration of a transmit opportunity (TXOP) during which at least the packet is transmitted, or a fifth indicator indicating a physical layer conformance procedure (PLCP) protocol data unit (PPDU) format of the packet.

18. The wireless communication device of claim 11, wherein the mark symbol is modulated using binary phase-shift keying (BPSK) modulation at a one-half coding rate for a 20 MHz channel.

19. The wireless communication device of claim 11, wherein the mark symbol immediately follows a legacy signal (L-SIG) field within the preamble of the packet.

20. A method for wireless communication by a wireless communication device comprising:
generating a packet for wireless transmission with a processor, wherein the packet includes a mark symbol in a preamble of the packet, the mark symbol including a cyclic redundancy check (CRC) field indicating a wireless communication protocol used in generating the packet; and
outputting the packet to a transmission interface for wireless transmission.

21. The method of claim 20, further comprising:
concatenating a first sequence of bits and a second sequence of bits to generate a combined sequence of bits, wherein the first sequence of bits corresponds to a value identifying the wireless communication protocol used in generating the packet; and
performing a cyclic redundancy check on the combined sequence of bits to generate a checksum, wherein the mark symbol includes the second sequence of bits and wherein the CRC field includes the checksum.

22. The method of claim 21, further comprising:
each of a plurality of wireless communication protocols including the wireless communication protocol, is associated with a respective sequence of bits from a plurality of sequences of bits.

23. The method of claim 20, further comprising:
performing a CRC on a sequence of bits to generate a checksum; and
masking the checksum using a mask pattern to generate a masked checksum, wherein the mask pattern identifies the wireless communication protocol, and wherein the mark symbol includes the sequence of bits and the CRC field includes the masked checksum.

24. The method of claim 23, further comprising:
associating each of a plurality of multiple wireless communication protocols with a respective mask pattern from a plurality of mask patterns.

25. The method of claim 20, further comprising:
setting a predefined CRC polynomial string that is configured to identify the protocol and that is known to both the wireless communication device and a receiver of a wireless transmission from the wireless communication device; and
performing a cyclic redundancy check on a sequence of bits in the mark symbol to generate a checksum, wherein the CRC field includes the checksum.

26. The method of claim 20, wherein the mark symbol further includes at least one of a first indicator indicating a basic service set (BSS) color, a second indicator indicating a bandwidth of the packet, a third indicator indicating whether spatial reuse is permitted, a fourth indicator indicating a duration of a transmit opportunity (TXOP) during which at least the packet is transmitted, or a fifth indicator indicating a physical layer conformance procedure (PLCP) protocol data unit (PPDU) format of the packet.

27. The method of claim 20, wherein the mark symbol is modulated using binary phase-shift keying (BPSK) modulation at a one-half coding rate for a 20 MHz channel.

28. The method of claim 20, further comprising placing the mark symbol immediately follows a legacy signal (L-SIG) field within the preamble of the packet.

* * * * *